US012603975B2

(12) United States Patent
Zhang et al.

(10) Patent No.: US 12,603,975 B2
(45) Date of Patent: Apr. 14, 2026

(54) MICRO LED PROJECTOR

(71) Applicant: JADE BIRD DISPLAY (SHANGHAI) LIMITED, Shanghai (CN)

(72) Inventors: Shuai Zhang, Shanghai (CN); Huiwen Xu, Shanghai (CN); Jian Guo, Shanghai (CN)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 18/760,003

(22) Filed: Jun. 30, 2024

(65) Prior Publication Data

US 2024/0357064 A1      Oct. 24, 2024

Related U.S. Application Data

(63) Continuation of application No. PCT/CN2022/144176, filed on Dec. 30, 2022.

(30) Foreign Application Priority Data

Dec. 31, 2021    (WO) ................ PCT/CN2021/143988
Dec. 31, 2021    (WO) ................ PCT/CN2021/143990

(51) Int. Cl.
    *H04N 9/31*        (2006.01)
    *H01L 25/16*       (2023.01)
    (Continued)

(52) U.S. Cl.
    CPC ......... *H04N 9/3152* (2013.01); *H01L 25/167* (2013.01); *H04N 9/3167* (2013.01);
    (Continued)

(58) Field of Classification Search
    CPC .. H04N 9/3152; H04N 9/3167; H01L 25/167; H10H 20/84; H10H 20/855;
    (Continued)

(56) References Cited

U.S. PATENT DOCUMENTS 10,879,217 B1    12/2020  Li et al.
11,533,180 B1 *  12/2022  Huang .................. H04L 9/0894
                          (Continued)

FOREIGN PATENT DOCUMENTS

CN        101598294 B     12/2014
CN        104638095 A      5/2015
          (Continued)

OTHER PUBLICATIONS

U.S. Appl. No. 62/863,559, filed Jun. 19, 2019 by Hong Kong Beida Jade Bird Display Limited.
(Continued)

*Primary Examiner* — Michael E Teitelbaum
(74) *Attorney, Agent, or Firm* — FINNEGAN, HENDERSON, FARABOW, GARRETT & DUNNER LLP

(57)              ABSTRACT

Disclosed herein is a micro LED projector comprising: a micro LED panel and a collimator unit. The micro LED structure in the micro LED panel comprises a mesa structure and a micro lens formed above the micro mesa structure, a p type semiconductor layer, an n type semiconductor layer and a light emitting layer formed between the p type semiconductor layer and the n type semiconductor layer. The center of the micro lens is at a straight line which connects the center of the light emitting layer with the center of the collimator unit. The present disclosure decreases the volume and the weight of the micro LED projector.

12 Claims, 27 Drawing Sheets

(51) Int. Cl.
    *H10H 20/84*         (2025.01)
    *H10H 20/855*       (2025.01)
    *H10H 20/858*       (2025.01)

(52) U.S. Cl.
    CPC .......... *H10H 20/84* (2025.01); *H10H 20/855*
          (2025.01); *H10H 20/858* (2025.01)

(58) Field of Classification Search
    CPC .............. H10H 20/858; G02B 19/0019; G02B
               19/0061; G02B 27/30; G02B 27/10;
               G09F 9/33; G03B 21/14; G03B 21/20
    See application file for complete search history.

(56)               References Cited

U.S. PATENT DOCUMENTS

| | | | |
|---|---|---|---|
| 2010/0079872 A1 | 4/2010 | Destain | |
| 2018/0090058 A1 | 3/2018 | Chen et al. | |
| 2018/0307129 A1 | 10/2018 | Shin et al. | |
| 2019/0270403 A1 | 9/2019 | Sobecki et al. | |
| 2021/0044880 A1* | 2/2021 | Kim | G06F 3/044 |
| 2021/0090487 A1 | 3/2021 | Chu et al. | |
| 2021/0124895 A1* | 4/2021 | Xiong | G06V 40/1324 |
| 2021/0159373 A1 | 5/2021 | Grundmann | |
| 2021/0384182 A1 | 12/2021 | Xu et al. | |
| 2022/0102390 A1* | 3/2022 | Lee | G02F 1/16756 |
| 2023/0164444 A1* | 5/2023 | Yang | H04N 23/55 |
| | | | 348/335 |

FOREIGN PATENT DOCUMENTS

| | | | |
|---|---|---|---|
| CN | 106025029 A | 10/2016 | |
| CN | 210403049 U | 4/2020 | |
| CN | 111403430 A | 7/2020 | |
| CN | 112185268 A | 1/2021 | |
| CN | 112802404 A | 5/2021 | |
| CN | 113544560 A | 10/2021 | |
| JP | 2013012518 A | 1/2013 | |
| TW | 201131202 A | 9/2011 | |
| WO | 2020139752 A1 | 7/2020 | |
| WO | 2020176783 A1 | 9/2020 | |

OTHER PUBLICATIONS

International Search Report and Written Opinion in PCT application No. PCT/CN2022/144176, dated Jan. 28, 2023.
International Search Report and Written Opinion in PCT application No. PCT/CN2021/143990, dated Sep. 28, 2022.
Extended European Search Report in European Patent Application No. 22915226.9, dated Dec. 5, 2025.

* cited by examiner

MICRO LED PROJECTOR

CROSS REFERENCE TO RELATED APPLICATIONS

This patent application claims the benefit of Patent Cooperation Treaty Application No. PCT/CN2022/144176, filed Dec. 30, 2022, which further claims the benefit of Patent Cooperation Treaty Application Nos. PCT/CN2021/143990, filed Dec. 31, 2021, and PCT/CN2021/143988, filed Dec. 31, 2021, each of which is incorporated by reference herein in its entirety.

FIELD OF THE INVENTION

The present disclosure generally relates to light emitting diode (LED) technology field and, more particularly, to a micro LED projector.

BACKGROUND OF THE INVENTION

Inorganic micro pixel light emitting diodes (hereinafter referred to as "μ-LEDs" or "micro LEDs") are of increasing importance because of their use in various applications including self-emissive micro-displays, visible light communications and optogenetics. The μ-LEDs showed higher output performance than conventional LEDs due to better strain relaxation, improved light extraction efficiency, and uniform current spreading. The μ-LEDs also exhibited improved thermal effects, operation at higher current density, fast response rate, larger work temperature range, higher resolution, color gamut, and contrast and lower power consumption as compared with conventional LEDs.

The inorganic μ-LEDs are conventionally manufactured by etching the III-V group epitaxial layers to form multiple mesas. Most of the light emitting from the sidewall of the mesa has a large emitting angle vertical to the micro display; however, the emitting light with large emitting angle is blocked and lost in the augmented reality (AR) device and would not reach human's eyes, thereby reducing the light emitting efficiency. Thus, it needs to reduce the loss of the emitting light from the sidewall of the mesa.

Furthermore, the chief ray angle of the conventional μ-LED cannot be changed and always emits along a vertical direction from the mesa top, which decreases the light emitted from the sidewall of the mesa, decrease the light emitting efficiency and light emitting intensity. Additionally, the chief ray angles of every μ-LED in the μ-LEDs array are same with each other, which reduce the application of the μ-LEDs array.

The above content is only used to assist in understanding the technical solutions of the present application, and does not constitute an admission that the above is prior art.

BRIEF SUMMARY OF THE DISCLOSURE

In order to overcome the drawback mentioned above, the present disclosure provides a micro LED projector, so as to control the chief ray angle of the micro LED structure and reduce the loss of the light emitting from the sidewall of the mesa, and to decrease the volume and the weight of the micro LED projector.

In accordance with the present disclosure, there is provided a micro LED projector comprising:

a micro LED panel, comprising a micro LED structure array, wherein, the micro LED structure comprises a mesa structure and a micro lens formed to be above the micro mesa structure, a p type semiconductor layer, a n type semiconductor layer, and a light emitting layer formed between the p type semiconductor layer and the n type semiconductor layer; and a collimator unit, formed to collimate rays emitted from the micro LED structure to a preset objective position; wherein, a connected straight line connects the center of the collimator unit, the center of the micro lens and the center of the light emitting layer.

In some embodiments, the center of the collimator unit is deviated from the connected straight line; wherein, the center of the micro lens and the center of the light emitting layer are at a first straight line; the center of the collimator unit and the center of the light emitting layer are at a second straight line.

In some embodiments, the second straight line is deviated from the first straight line.

In some embodiments, the deviated angle of the second straight line deviated from the first straight line is not more than 5°.

In some embodiments, the center of the light emitting layer is horizontally deviated from the connected straight line.

In some embodiments, the deviated distance of the center of the light emitting layer horizontally deviated from the connected straight line is not more than 45% of the bottom width of the mesa structure.

In some embodiments, the deviated distance of the center of the light emitting layer is not more than 0.3 km.

In some embodiments, the distance between the micro LED panel and the surface of the collimator unit is not greater than the thickness of the collimator unit.

In some embodiments, the shape of the micro lens is a semi-sphere or a sphere.

In some embodiments, the micro LED structure further comprises a capping layer, formed to be above the micro mesa structure and covering the micro lens.

In some embodiments, the material of the capping layer is selected from polymers, inorganic oxide, and inorganic nitride.

In some embodiments, the inorganic oxide is silicon oxide and the inorganic nitride is silicon nitride.

In some embodiments, the center axis of the micro lens is shifted from the center axis of the mesa structure horizontally.

In some embodiments, the micro LED structure further comprises a spacer at the bottom of the micro lens and on the top of the mesa structure.

In some embodiments, the material of the spacer is selected from polymers, inorganic oxide, and inorganic nitride.

In some embodiments, the inorganic oxide is silicon oxide and the inorganic nitride is silicon nitride.

In some embodiments, the material of the capping layer is different from the material of the micro lens.

In some embodiments, the material of the micro lens is selected from polymers, inorganic oxide, and inorganic nitride.

In some embodiments, the inorganic oxide is silicon oxide and the inorganic nitride is silicon nitride.

In some embodiments, the diameter of the micro lens is 80%~200% of the diameter of the mesa structure.

In some embodiments, the distance between the focal point of the micro lens and the light emitting layer is not greater than two times of the thickness of the mesa structure.

In some embodiments, the micro LED structure further comprises an antireflective film, formed on at least part of the surface of the micro lens.

In some embodiments, the antireflective film is formed on the surface position where the ray is emitted from the micro lens.

In some embodiments, the chief ray is inclined to the top surface of the micro mesa structure and is emitted from the micro lens at an angle in a range of 0~45° relative to the vertical direction.

In some embodiments, the chief ray is vertical to the top surface of the micro mesa structure and is emitted from the top center of the micro lens.

In some embodiments, the antireflective film is formed on the top of the micro lens.

In some embodiments, the antireflective film is formed on the entire surface of the micro lens.

In some embodiments, the thickness of the antireflective film on the surface position where the ray is emitted from the micro lens is greater than the thickness of the antireflective film on the other positions of the micro lens.

In some embodiments, the thickness of the antireflective film on the top of micro lens is greater than the thickness of the antireflective film on the other positions of the micro lens.

In some embodiments, the dielectric constant of the antireflective film is between the dielectric constant of the micro lens and the dielectric constant of air.

To achieve the above objective, the present disclosure further provides a micro LED projector, comprising:

a first color micro LED panel as above mentioned micro LED panel, emitting a first color ray;

a second color micro LED panel as above mentioned micro LED panel, emitting a second color ray; wherein, the first color is different from the second color;

an optical combination element, facing the first color ray emitting direction of the first color micro LED panel and facing the second color ray emitting direction of the second color micro LED panel, formed to combine the first color ray and second color ray into a combined ray;

a collimator unit as above mentioned collimator, formed to collimate the ray emitted from the micro LED structure to a preset objective position.

In some embodiments, the optical combination element comprises a polarizing spectroscopic film, facing the first color ray emitting direction of the first color micro LED panel and facing the second color ray emitting direction of the second color micro LED panel.

In some embodiments, the micro LED projector further comprises a third color micro LED panel as above mentioned micro LED panel, emitting a third color ray; wherein, the first color, the second color, and the third color are different from each other.

In some embodiments, the optical combination element comprises a polarizing spectroscopic film, facing the third color ray emitting direction of the third color micro LED panel.

In some embodiments, the optical combination element is an X-cube.

In some embodiments, the minimum distance between the micro LED panel and the surface of the optical combination element facing the micro LED panel is not greater than twice of the thickness of the micro LED panel.

In some embodiments, the collimated light emits from an output surface of the optical combination element and then enters into an input surface of the collimator unit; the distance between the output surface of the optical combination element and the input surface of the collimator unit is not more than 200% of the thickness of the collimator unit.

In some embodiments, the diameter of the collimator unit is smaller than the side width of the X-cube.

Additionally in accordance with the present disclosure, there is provided a micro LED projector comprising:

at least one color micro LED panel comprising multiple micro LEDs; the chief ray angles of the micro LEDs in the micro LED panel are different;

a collimator unit, configured to collimate the ray emitted from the micro LED panel to a preset objective position; the micro LED panel has a light emitting area and the collimator has an input surface, the light emitted from the light emitting area of the micro LED panel enters into the input surface of the collimator.

In some embodiments, the chief ray angle of the micro LEDs in the at least one color micro LED panel are collimated into a point.

In some embodiments, at least two kinds of color micro LED panel, each of the micro LED panel emitting one color ray; and, the chief ray angles of the micro LEDs in each of the micro LED panel are collimated into a point.

In some embodiments, at least a first color micro LED panel, emitting a first color ray; a second color micro LED panel, emitting a second color ray; and a third color micro LED panel emitting a third color ray; wherein, the first color, the second color and the third color are different from each other; and, the chief ray angle of the micro LEDs in the first color micro LED panel are collimated into a point, the chief ray angle of the micro LEDs in the second color micro LED panel are collimated into a point and the chief ray angle of the micro LEDs in the third color micro LED panel are collimated into a point.

In some embodiments, the micro LED projector further comprises an optical combination element, facing the color ray emitting directions of each color of the micro LED panels, configured to combine the color rays into a combined ray; wherein, the collimated light emits from an output surface of the optical combination element and then enters into an input surface of the collimator unit.

In some embodiments, the area of the output surface is greater than the area of the input surface.

In some embodiments, the diameter of the collimator unit is smaller than the side width of the optical combination element.

In some embodiments, the optical combination element has several receiving surfaces corresponding to each of the light emitting areas of the micro LED panels, respectively; and, the minimum distance between the micro LED panel and the receiving surface of the optical combination element is not greater than 200% of the thickness of the micro LED panel.

In some embodiments, the side width of the receiving surface of the optical combination element is smaller than the side width of the light emitting area of the first color micro LED panel.

In some embodiments, the distance between the output surface of the optical combination element and the input surface of the collimator unit is not more than 200% of the thickness of the collimator unit.

In some embodiments, the distance between the output surface of the optical combination element and the input surface of the collimator unit is zero.

In some embodiments, the optical combination element comprises a polarizing spectroscopic film, facing the first color ray emitting direction of the first color micro LED panel and facing the second color ray emitting direction of the second color micro LED panel.

In some embodiments, the micro LED projector further comprises a third color micro LED panel, emitting a third color ray; wherein, the first color, the second color, and the third color are different from each other.

In some embodiments, the optical combination element comprises a polarizing spectroscopic film, facing the third color ray emitting direction of the third color micro LED panel.

In some embodiments, the optical combination element is an X-cube.

In some embodiments, the diameter of the collimator unit is smaller than or equal to the side width of the X-cube.

In some embodiments, the light emitting area of the micro LED panel is greater than the input surface of the collimator unit.

In some embodiments, the width of the micro LED panel is larger than the diameter of the input surface of the collimator unit.

Many other advantages and features of the present disclosure will be further understood by the following detailed descriptions and the appended drawings.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Embodiment 1

Figures 1, 2:
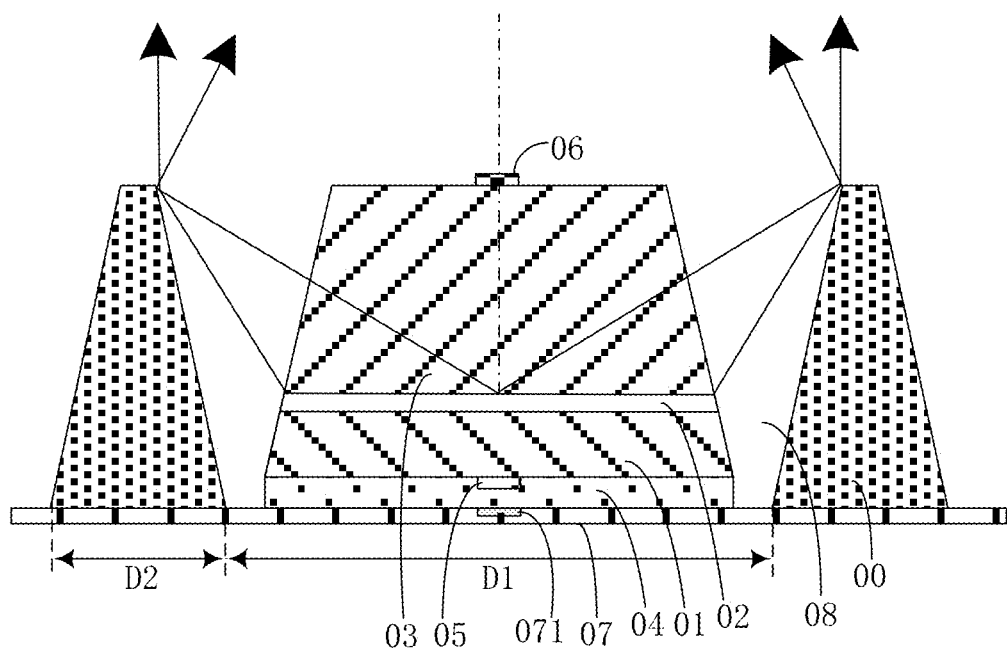
FIG. 1 is a structure diagram of a micro LED structure according to a first embodiment of the present disclosure.
FIG. 2 is a structure diagram of a micro LED structure with the minimized reflective structure according to a first embodiment of the present disclosure.

Referring to FIG. 1, the micro LED structure according to the embodiment comprises: a mesa structure and a reflective structure 00. The mesa structure can be a micro LED structure at least comprising one light emitting unit: a first type semiconductor layer 01, a second type semiconductor layer 03 and a light emitting layer 02. The micro LED structure can further comprise: a top contact 06 and a bottom contact 05. The light emitting layer 02 is formed on the top of the first type semiconductor layer 01, and the second type semiconductor layer 03 is formed on the top of the light emitting layer 02. The first type semiconductor layer 01 and the second type semiconductor layer 03 are different conductive types. For example, in some embodiments, the first type semiconductor layer 01 is P type, while the second type semiconductor layer 03 is N type; or, the first type semiconductor layer 01 is N type, while the second type semiconductor layer 03 is P type. Preferably, the material of the first type semiconductor layer 01 is p-GaAs, p-AlGaInP, p-GaN, etc. and the material of the second type semiconductor layer 03 is n-GaAs, n-AlGaInP, n-GaN, etc. The light emitting layer 02 is formed by a quantum well layer. In some embodiments, the material of the quantum well layer is AlGaInP/GaInP, GaN/InGaN, GaAs, GaN, etc. Preferably, the thickness of the first type semiconductor layer 01 is lower than the thickness of the second type semiconductor layer 03; and the thickness of the light emitting layer 02 is less than the thickness of the first type semiconductor layer 01. Preferably, the thickness of the first type semiconductor layer 01 ranges from 50 nm to 2 μm, the thickness of the second type semiconductor layer 03 ranges from 100 nm to 2 km. Preferably, the thickness of the quantum well layer is not greater than 30 nm; or, the quantum well layer includes not more than six pairs of quantum wells.

The reflective structure 00 is formed to reflect the rays emitted from the sidewall of the mesa structure toward outside. The reflective structure 00 can be formed around the mesa structure.

Figure 3:
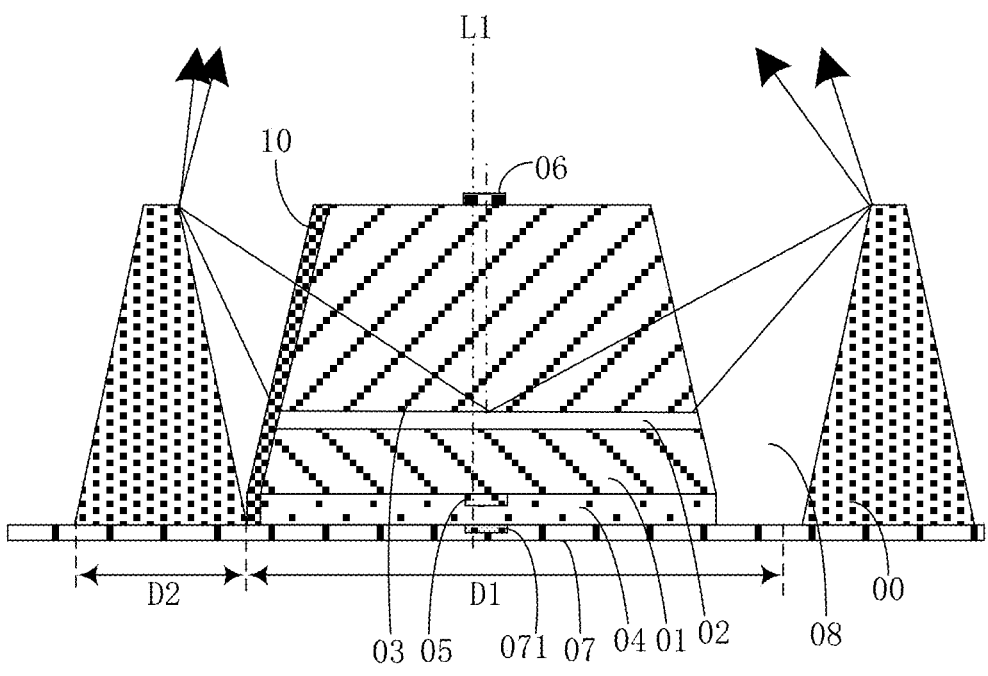
FIG. 3 is a structure diagram of a micro LED structure with the minimized reflective structure according to a first embodiment of the present disclosure.
Figure 4:
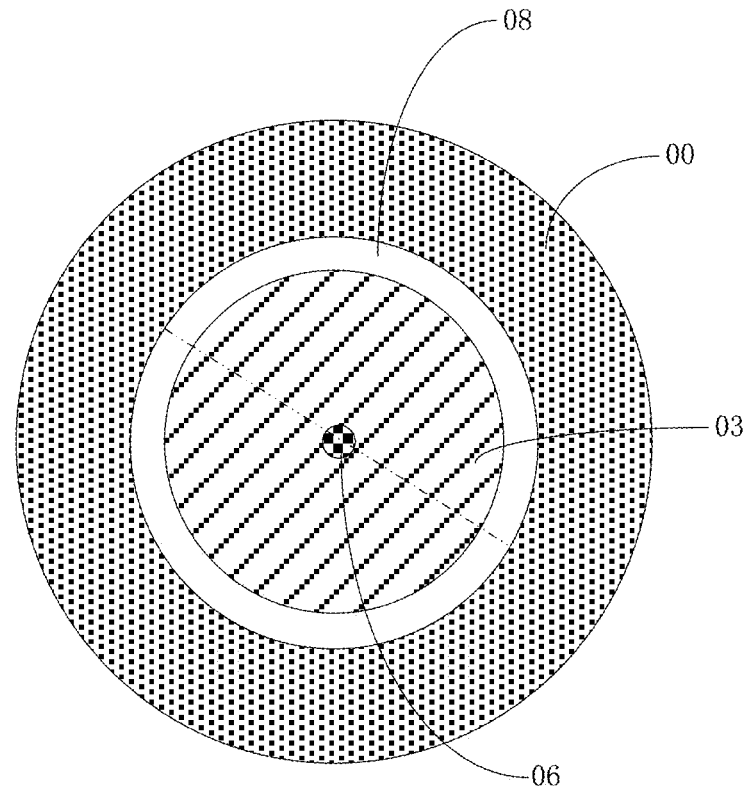
FIG. 4 is a top view of a micro LED structure according to a first embodiment of the present disclosure.
Figure 5:
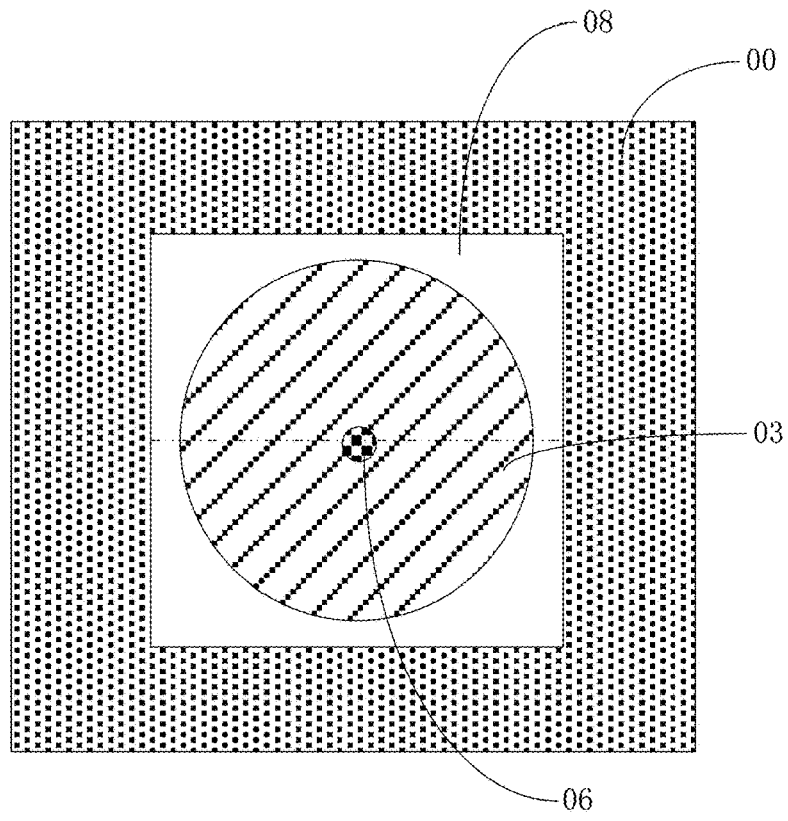
FIG. 5 is a top view of another micro LED structure according to a first embodiment of the present disclosure.

Referring to FIG. 1, when the center axis of the reflective structure L1 is aligned with the center axis of the mesa structure, the chief ray of the micro LED structure is aligned with the center axis of the mesa structure. Referring to FIGS. 2 and 3, when the center axis L1 of the reflective structure is not aligned with the center axis of the mesa structure, the chief ray of the micro LED structure is shifted from the center axis of the mesa structure in a certain angle. The center axis of the reflective structure is shifted from the center axis of the mesa structure, so as to change a chief ray angle of the micro LED structure. In some embodiments consistent with FIGS. 1 and 2, in order to shift the center axis of the reflective structure, the gap width D1 of the reflective structure can be either increased or decreased with one position of the reflective structure as a fixing point. In some embodiments consistent with FIGS. 1 and 3, the whole reflective structure is shifted from left to right, while the gap width D1 of the reflective structure is not changed. More specifically, the D1 represents the bottom width of the hollow opening in the inner of the reflective structure. In some embodiments consistent with FIG. 4, the hollow opening is a cylinder, the D1 is a diameter of the cylinder (as shown by the dotted line in FIG. 4). In some embodiments consistent with FIG. 5, the hollow opening is a rectangle, the D1 is a width or length of the rectangle (as shown by the dotted line in FIG. 5). The chief ray angle is the angle of the chief ray relative to the center axis direction of the reflective structure.

Preferably, the chief ray angle of the micro LED structure being reflected by the reflective structure is in the range of 0~45°. The distance between the center axis L1 of the reflective structure 00 and the center axis of the mesa structure is greater than 50% of the bottom width of the mesa structure; and, preferably, not greater than 100% of the bottom width of the mesa structure. Additionally, a protective isolation layer 10 can be formed at the sidewall surface of the mesa structure, so the bottom edge of the reflective structure 00 can contact to the protective isolation layer 10 without any space between the bottom edge of the mesa structure and the bottom edge of the reflective structure 00.

In some embodiments, the sidewall of the reflective structure 00 is inclined relative to the vertical direction. Preferably, the inclined angle of the sidewall of the reflective structure 00 facing the mesa structure is in the range of 0~60° relative to the vertical level. The top of the reflective structure 00 can be higher or lower or equal to the top of the mesa structure. Preferably, the height of the reflective structure 00 is 10%~200% of the height of the mesa structure. The bottom thickness D2 of the reflective structure 00 is 10%~90% in length of the space between the bottom edge of the mesa structure and the bottom edge of the reflective structure 00. In some embodiments, the D2 represents the largest thickness of the reflective structure 00 from the edge of the hollow opening to the out edge of the reflective structure 00. In some embodiments consistent with FIGS. 1~3 and 6, the D2 is the bottom thickness of the reflective structure 00 from the bottom edge of the hollow opening to the bottom outer-edge of the reflective structure 00. In some embodiments consistent with FIG. 7, the D2 is the top thickness of the reflective structure 00 from the top edge of the hollow opening to the top out edge of the reflective structure 00. In some embodiments, the hollow opening is formed by the inner sidewall of the reflective structure 00.

Figure 6:
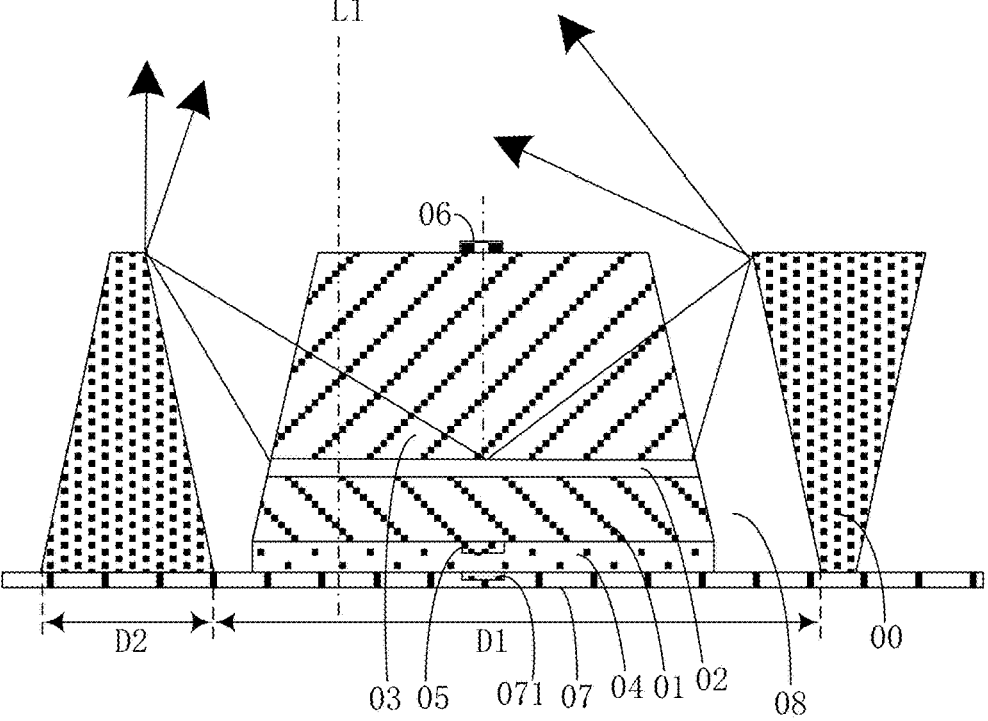
FIG. 6 is a structure diagram of a micro LED structure according to a first embodiment of the present disclosure.
Figure 7:
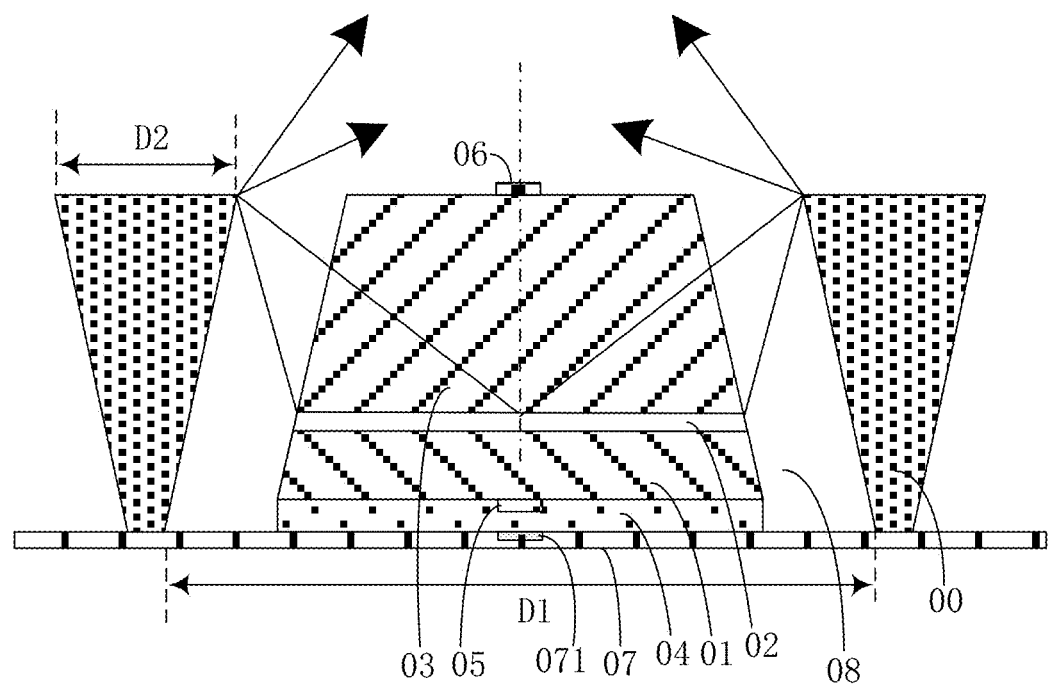
FIG. 7 is a structure diagram of a micro LED structure according to a first embodiment of the present disclosure.

In some embodiments, the sidewall of the mesa structure is inclined relative to the horizontal level. Preferably, the inclination direction of the sidewall of the mesa structure is in a cross direction with the inclination direction of the sidewall of the reflective structure 00, which is facing the mesa structure. In some embodiments consistent with FIG. 6, part of the sidewall of the mesa structure is parallel to the inner sidewall of a right half of the reflective structure 00 which faces the mesa structure, while the sidewall of the mesa structure is not parallel to the inner sidewall of another left half of the reflective structure 00, so the center axis of the reflective structure 00 is shifted from right to left. When the sidewall of the mesa structure is parallel to the inner sidewall of a left half of the reflective structure, which is facing the mesa structure, while the sidewall of the mesa structure is not parallel to the inner sidewall of the right half of the reflective structure 00, the center axis L1 of the reflective structure 00 is shifted from left to right, as shown in FIG. 6. In some embodiments consistent with FIG. 7, the whole sidewall of the reflective structure 00 can be parallel to the sidewall of the mesa structure, and the center axis L1 of the reflective structure 000 is aligned with the center axis of the mesa structure.

Preferably, the reflective structure 00 is made of high reflective metal or polymer or a distributed Bragg reflector or high reflective polymer. Preferably, the high reflective metal is selected from one or more of Ag, Au, Al and etc. Preferably, the high reflective polymer is polytetrafluoroethylene, etc.

Figure 8:
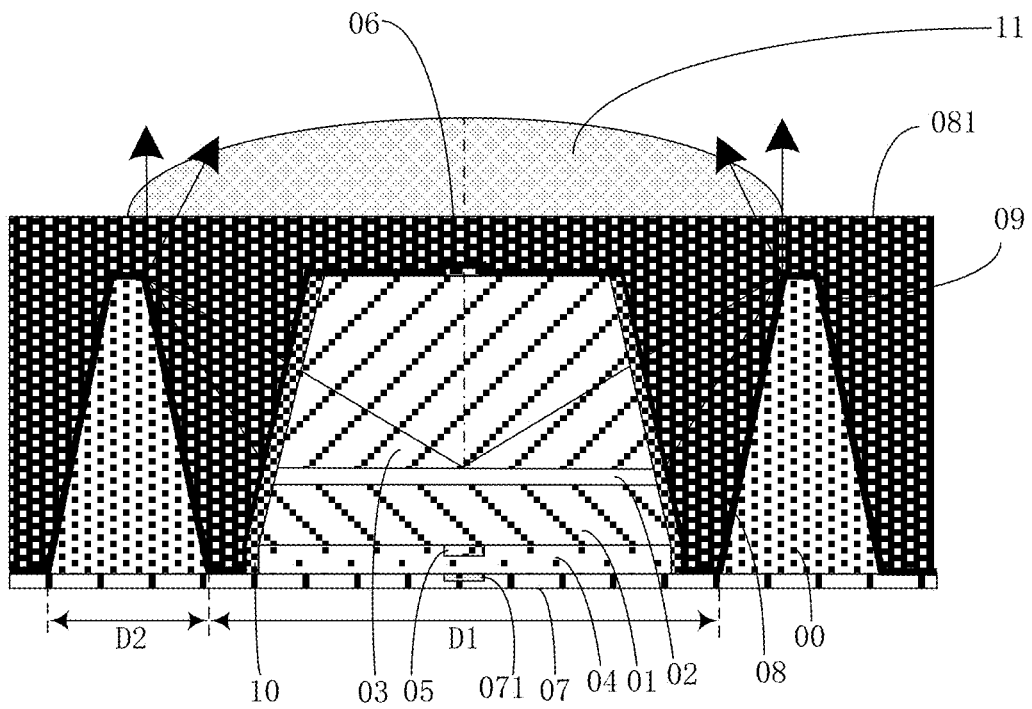
FIG. 8 is a structure diagram of a micro LED structure according to a first embodiment of the present disclosure.

In some further embodiment consistent with FIG. 8, a top conductive layer 09 is formed on the top of the mesa structure and on the top surface of the reflective structure 00, so the second type conductor layer 03 can be electrically connected with the reflective structure 00 by the top conductive layer 09. A top contact 06 is formed between the top conductive layer 09 and the top of the mesa structure. A bottom contact 05 and a bottom conductive structure 04 are sequentially formed at the bottom of the mesa structure. An IC back plane 07 is formed at the bottom of the mesa structure and electrically connected with the bottom conductive structure 04 via a contact pad 071. It is noted that, the top conductive layer 09 is transparent herein. Herein, an isolation layer 10 is formed on the sidewall of the mesa structure and the top conductive layer 09 is formed on the isolation layer 10, on the top of the mesa structure, on the top contact 06, and the exposed top surface of the IC back plane 07. It is noted that, in another embodiment, the isolation layer 10 may be formed on the top of the mesa structure, so the isolation layer 10 is formed on the side wall and the top of the isolation layer, and not formed directly on the top of the mesa structure. In some embodiments, the top conductive layer 09 is formed on the sidewall and the top of the reflective structure 00. In another embodiment, the top conductive layer 09 is firstly formed on the mesa structure and on the top of the IC back plane 07, and then the reflective structure 00 can also be formed on the top conductive layer 09 around the mesa structure. The isolation layer 10 is further formed on the top of the IC back plane 07, so the top conductive layer 09 can be formed on the isolation layer 10 which is on the top of the IC back plane 07, but not formed directly on the top of the IC back plane. It is noted that, the top conductive layer 09 can be transparent. The material of the top conductive layer 09 can be ITO, FTO, etc.

In some embodiments, a micro lens 11 is formed above the mesa structure. Herein, a spacer 081 is formed at the bottom of the micro lens 11 and on the top conductive layer 09. It is noted that the micro lens 11 can be directly formed on the top conductive layer 09 in another embodiment. A dielectric layer 08 is formed between the mesa structure and the reflective structure 00. The material of the spacer 081 can be the same as the material of the dielectric layer 08.

In some embodiments, the chief ray angle of the micro LED structures can be changed by changing the position of the reflective structure 00. It is noted that, the mesa structure can emit one color or more colors. Consistent with the above description, the mesa structure comprises one light emitting unit. In some embodiments, the mesa structure comprises multiple light emitting unit; the light emitting units emit different color rays. In some embodiments, the mesa structure comprises two light emitting units and each of the light emitting units emits different colors from each other. In some embodiments, the mesa structure comprises three light emitting units and each of the light emitting units emits different colors from each other, which can be referred to in US patent applications U.S. 62/863,559 and U.S. Ser. No. 16/567,077.

In some further embodiments, the aforementioned micro LED structure can be applied into a micro LED projector field. In some embodiments consistent with FIG. 9, the micro LED projector comprises: a first micro LED panel 201, a second micro LED panel 202, and an optical combination element 301. Consistent with FIG. 9, the dotted line represents an interface for showing the image or a human eye, and the arrow represents the ray emitted from the micro LED panels.

The first micro LED panel 201 emits a first color ray, wherein, the first micro LED panel 201 comprises a first micro LED array, in which the first micro LED structure is selected from the aforementioned micro LED structure with a first color light emitting layer. The second micro LED panel 202 emits a second color ray; wherein, the second micro LED panel 202 comprises a second micro LED array, in which the second micro LED structure is selected from the aforementioned micro LED structure with a second color light emitting layer. The optical combination element 301 is formed to receive rays emitted from the first micro LED panel 201 and the rays emitted from direction of the second micro LED panel 202. In some further embodiments, the optical combination element 301 comprises a polarizing spectroscopic film, facing the first color ray emitted from the first micro LED panel 201 and the second color ray emitted from the second micro LED panel 202. In some embodiments consistent with FIG. 9, the optical combination element 301 is made by two lens with a dichroic film on the inclined interface, wherein the inclined line represents the dichroic film. The dichroic film only transmits the ray emitted from the second micro LED panel 202 and reflects the ray emitted from the first micro LED panel 201. In some embodiments, the second micro LED panel 202 emits two different color light such as a second color light and a third color light, and the first micro LED panel 201 only emits single first color light; wherein, the first color, the second color, and the third color are different from each other. Herein, the chief ray angle of the first micro LED panel 201 is 0° and the rays emitted from the first micro LED panel 201 are parallel to each other; and the chief ray angle of the second micro LED panel 202 is 0° and the rays emitted from the second micro LED panel 202 are parallel to each other. The chief ray angle of the micro LEDs in the first micro LED panel and the chief ray angle of the micro LED s in the second micro LED panel are symmetrical based on the inclined interface. Herein, the chief ray angle of the micro LEDs in the first micro LED panel 201 and the chief ray angle of the micro LEDs in the second micro LED panel 202 are symmetrical based on the inclined interface.

Figure 10:
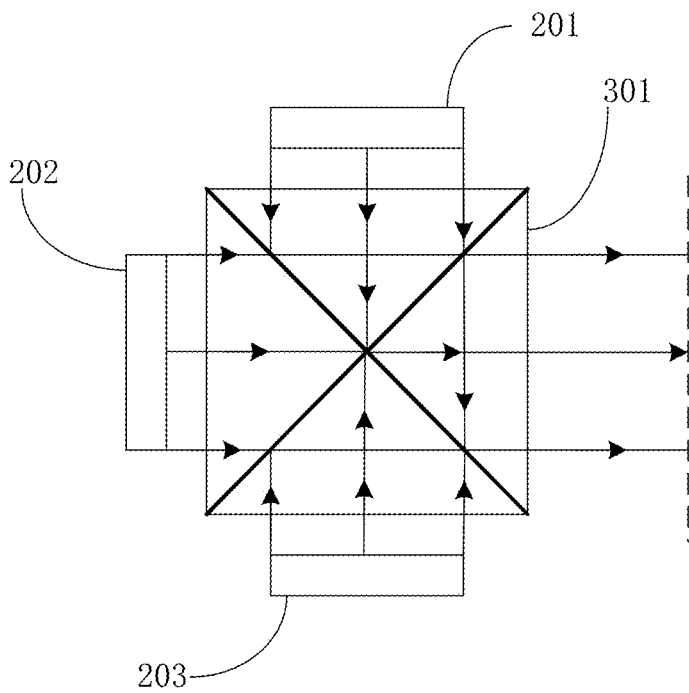
FIG. 10 is a structure diagram of a micro LED projector according to a first embodiment of the present disclosure.

In some embodiments consistent with FIG. 10, a first micro LED panel 201 emits a first color ray; wherein, the first micro LED panel 201 comprises a first micro LED array, in which the first micro LED structure is selected from the aforementioned micro LED structure with a first color light emitting layer. The second micro LED panel 202 emits a second color ray; wherein, the second micro LED panel 202 comprises a second micro LED array, in which the second micro LED structure is selected from the aforementioned micro LED structure with a second color light emitting layer. A third micro LED panel 203 is further comprised in the embodiment. The third micro LED panel 203 emits a third color ray; the third micro LED panel 203 comprises a third micro LED array, in which the third micro LED structure is selected from the aforementioned micro LED structure with a third light emitting layer; wherein, the first color, the second color and the third color are different from each other. The optical combination element 301 comprises a first polarizing spectroscopic film, facing the first color ray emitted from the first micro LED panel 201 and the second color ray emitted from the second micro LED panel 202. The optical combination element 301 further comprises a second polarizing spectroscopic film facing the third color ray emitting direction of the third micro LED panel 203 and the second color ray emitting direction of the second micro LED panel 202. Preferably, the optical combination element 301 is an X-cube. The X-cube comprises dichroic films arranged as an "X" shape. The structure of the X-cube can be understood by those skilled in the field, which will not be described herein anymore. It is noted that, the first color, the second color, the third color can be selected from red, blue, green, orange, yellow, etc. Herein, the micro LED panels are assembled on different surfaces of the X-cube and the micro LED panels are facing the dichroic films; furthermore, two adjacent micro LED panels 201 and 202 or 202 and 203 are mirror images with the dichroic film between the adjacent two micro LED panels 201 and 202, or 202 and 203 as a mirror. It is noted that, in some embodiments, the optical combination element 301 can also be an "X" optical combination panel instead of the X-cube. A support frame may contain the optical combination element 301 in which the surfaces of the X-cube exposed, so the ray emitted from the micro LEDs can enter into the X-cube.

In some further embodiments, the X-cube 301 can be fixed in a support frame by an adhesive material or by a mechanical connecting method without the adhesive material. For example, the micro LED panels can be adhered onto the support frame by glue or adhesive material; or, the micro LED panels can be mechanically connected with the optical combination element 301, such as the micro LED panels are clamped with the support frame. It is noted that, the micro LED panels can be directly formed on the surfaces of the X-cube. A cooling element may be formed at the back of the micro LED panels, so as to transfer heat of the micro LED panels to outside. In another embodiment, the cooling element can be formed on the support frame which is connected with the micro LED panels, so as to transfer the heat of the support frame and the micro LED panels to outside.

Herein, a micro LED package structure for micro LED panels is disclosed. The micro LED package structure comprises: a main circuit board comprising a printed circuit for controlling the micro LED panels; circuit branches separately connected with the main circuit board; and, micro LED panels, separately configured onto the end surfaces of the circuit branches. Furthermore, the width of the circuit branches is equal to or less than the width of an X-cube with which the circuit branches are assembled. Preferably, the circuit branches are flexible to be folded and assembled with an optical combination element. It is noted that, the micro LED panels are separately configured on each of the circuit branches and electrically connected with each of the circuit branches.

Figure 11:
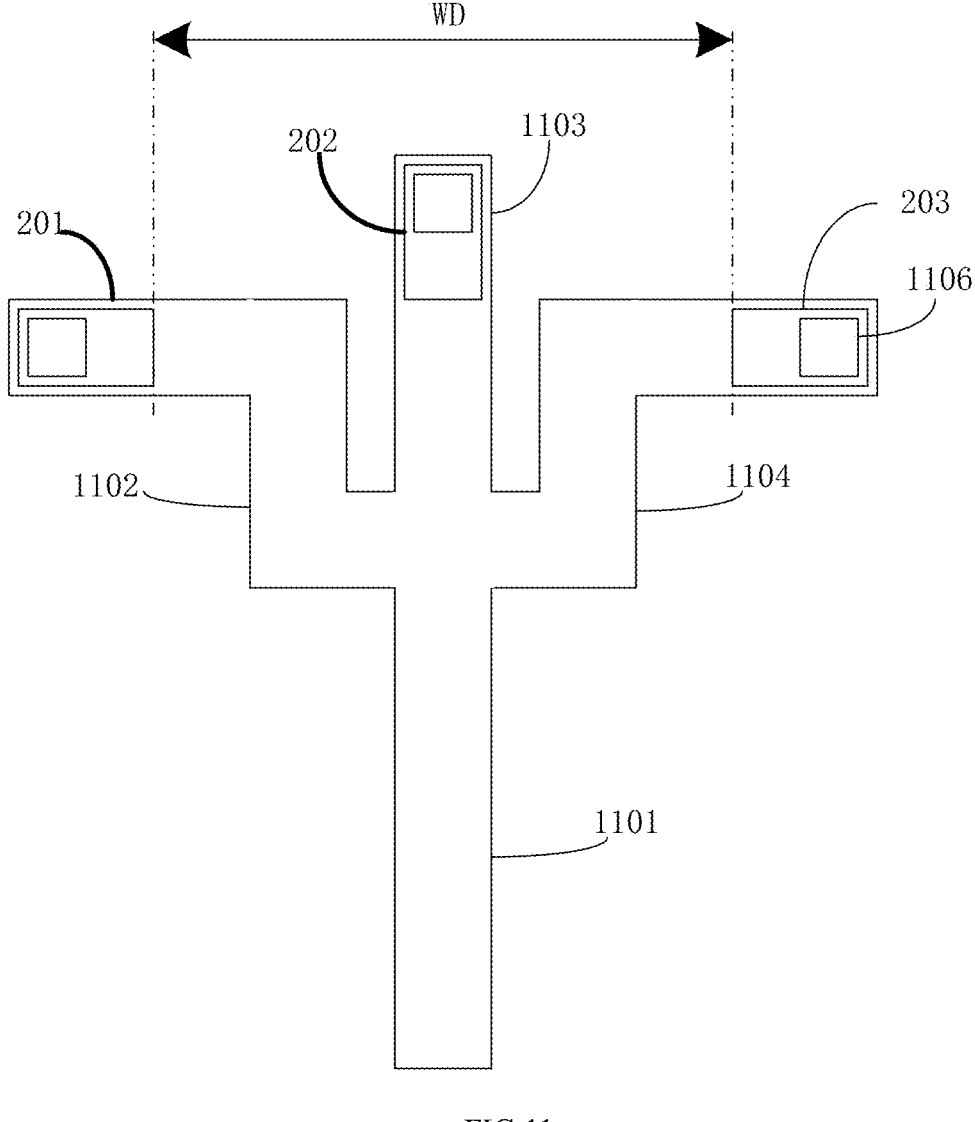
FIG. 11 is a structure diagram of a micro LED package according to a first embodiment of the present disclosure.

Referring to FIG. 11, each of the micro LED panels 201, 202, and 203 can be packaged before being assembled with the optical combination element 301. In some embodiments, at least three micro LED panel are packaged together in a printed circuit board such as an FPC (flexible printed circuit) board. The micro LED panels 201, 202, and 203 are separately configured on each of the circuit branches and electrically connected with each of the circuit branches. Furthermore, the micro LED panels 201, 202, and 203 are configured on the end surface of each of the circuit branches. In some embodiments, the bottom edge of the micro LED panel 201, 202, 203 in one of the circuit branches is not lower than the side edge of the other circuit branches.

A micro LED optical module comprising the aforementioned micro LED package structure for micro LED panels is further disclosed herein. Wherein, the micro LED package structure is assembled with the micro optical combination element 301. The micro LED panels are assembled facing the optical combination element 301. Preferably, the width of the circuit branches is equal to or less than the width of the X-cube (the optical combination element 301). In some embodiments, the top of the micro LED panels 201, 202, 203 are in a same horizontal level. Additionally, the circuit branches 1102, 1103, 1104 are flexible to be assembled with the optical combination element 301; and the circuit branches 1102, 1103, 1104 are folded to face the optical combination element 301. In another embodiment, the circuit branches 1102, 1103, 1104 are not flexible to be assembled with the optical combination element 301.

Figure 12:
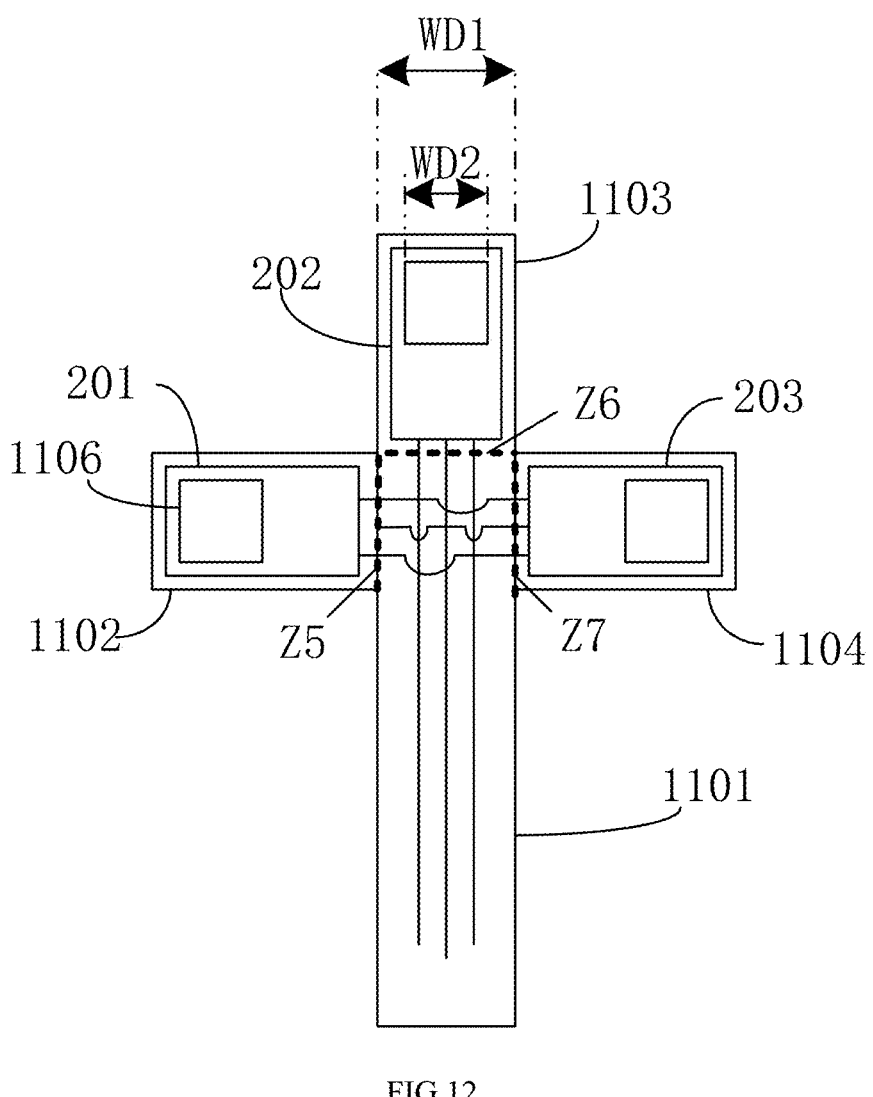
FIG. 12 is a structure diagram of a micro LED package according to a first embodiment of the present disclosure.
Figure 13:
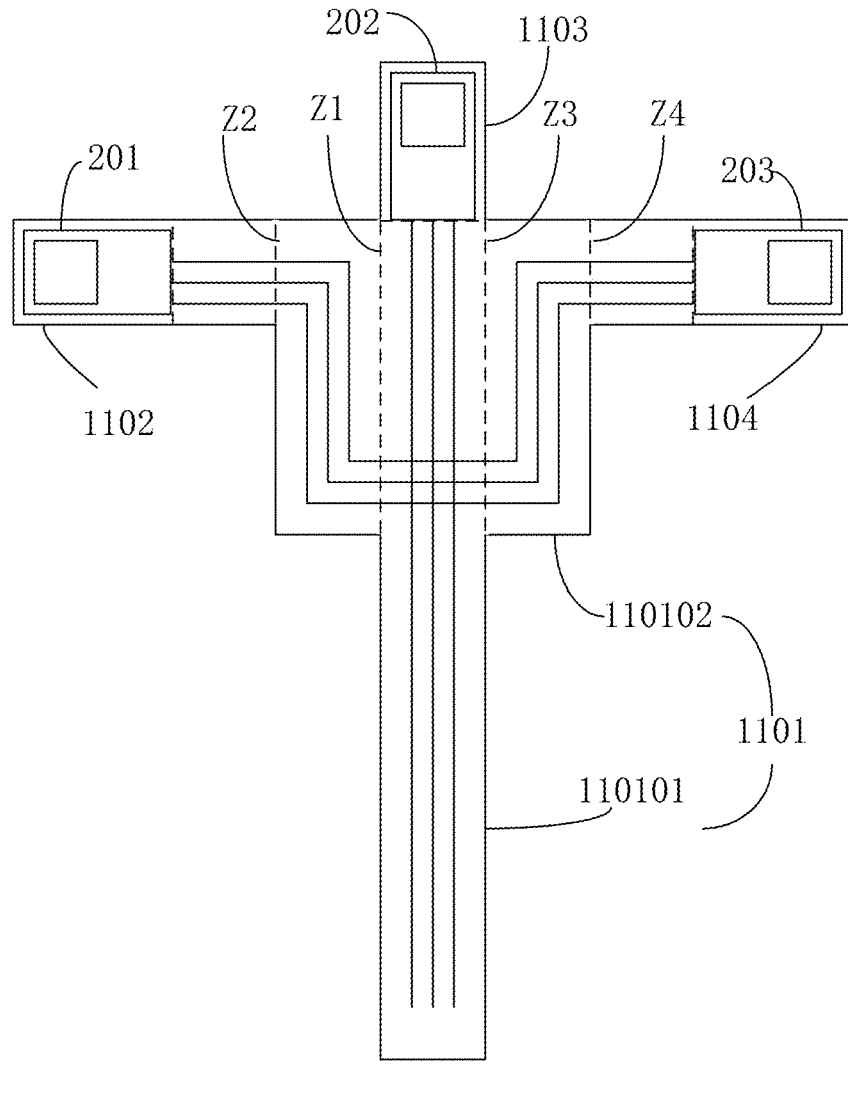
FIG. 13 is a structure diagram of a micro LED package according to a first embodiment of the present disclosure.

In some embodiments consistent with FIG. 11, the FPC board comprises a main circuit board 1101 and multiple circuit branches 1102, 1103, and 1104 from the main board 1101. The circuit branches 1102, 1103, and 1104 are formed to be flexible and capable of being folded and assembled with an optical combination element 301, so the circuit branches 1102, 1103, and 1104 are folded to face the optical combination element 301. The circuit of the main board 1101 is the same as the circuit of the branches 1102, 1103, and 1104. In some embodiments, three micro LED panel 201, 202, and 203 are formed onto the end surface of the branches (a first branch 1102, a second branch 1103, and a second branch 1104) and electrically connected with the circuit of the branches. Preferably, the first branch 1102 and the third branch 1104 are symmetrical relative to the center axis of the second branch 1103. The three micro LED panels 201, 202, and 203 can be formed with the optical combination element 301 (as shown in FIG. 10) by folding or bending the branches in any direction, so as to form the assembled structure consistent with FIG. 10. In some embodiments consistent with FIGS. 10 and 11, the distance WD between the bottom edge of the micro LED panel 201 in the first branch 1102 and the bottom edge of the micro LED panel 203 in the third branch 1104 is equal to or close to the width of the optical combination element 301; therefore, the top edges of the three micro LED panels 201, 202, and 203 are in a same horizontal level when formed with the optical combination element 301 (as shown in FIG. 10). In some embodiment, the first branch 1102 and the third branch 1104 can be folded and overlapped together to form the FPC board, which is shown in FIG. 12. In some embodiments consistent with FIGS. 10 and 12, the width WD1 of the branch 1103 is equal to or close to the width of the X-cube 301; and, the width of the X-cube 301 can be less than the width of the branch 1103; such as, the width of the X-cube 301 can be not less than the width of an active emitting area or a light area. The active emitting area 1106 is the light emitting area of the micro LED panel 201; and, the light area is the rays transmitting area on the X-cube 301 surface which is formed by the rays emitted from the micro LED panel 201. Preferably, in some embodiments consistent with FIG. 13, the FPC comprises a main board 1101 and three branches 1102, 1103, and 1104. The main board 1101 comprises a bottom board 110101 and the top board 110102. The width of the top board 110102 is greater than the width of the bottom board 110101. The circuits in the bottom board 110101 are divided into three sub-circuits. The three sub-circuits are separately connected with the micro LED panel 201, 202, 203 and separately formed in the three branches 1102, 1103, and 1104. The first branch 1102 can be folded along the dotted line Z1 and Z2 separately and the third branch 1104 can be folded along the dotted line Z3 and Z4, so as to form the FPC board as shown in FIG. 12. In some embodiment consistent with FIG. 12, the first branch 1102 can be folded along the dotted line Z5, the second branch 1103 can be folded along the dotted line Z6 and the third branch 1104 can be folded along the dotted line Z7, so as to form the assembled structure that three micro LED panels 201, 202, and 203 around an X-cube 301 as shown in FIG. 10. It is noted that, the FPC board in the embodiment consistent with FIG. 12 not only can be formed by folding the branches, but also can be formed by directly printing circuits on the main board and the branches without folding the branches. It should be noted that, the shape of the micro LED panels can be rectangle, square, etc. The profile of the micro LED array area in the micro LED panel can be rectangle, square, etc. Herein, the width of the first circuit branch 1102, the width of the second circuit branch 1103, and the width of the third circuit branch 1104 are the same. It is noted that, in some embodiments, the circuit branches

1102, 1103, 1104 are not flexible to be assembled with an optical combination element 301.

Figure 14:
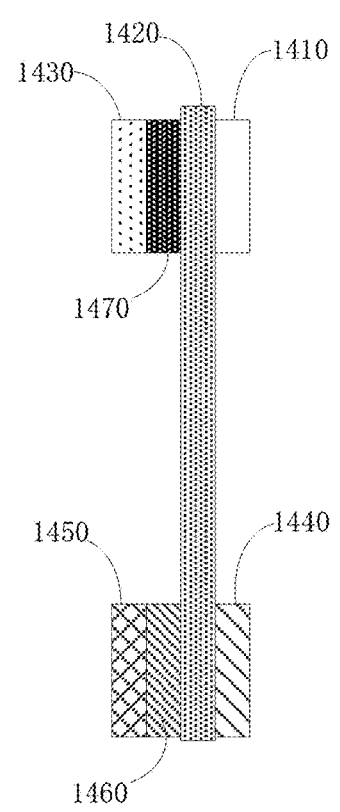
FIG. 14 is a structure diagram of a micro LED package according to a first embodiment of the present disclosure.

In some embodiments, one end of the FPC board for supporting the micro LED panel comprises a support base on the opposite side relative to the micro LED panel. The other end of the FPC board comprises a connector and a memory. In some embodiments consistent with FIG. 14, a circuit board 1420 has a strip shape and is made of a flexible material, for example, the circuit board 1420 is a flexible printed circuit (FPC) board. Therefore, the circuit board 1420 can withstand bending force and prevent easily breaking. The circuit board 1420 has a first end and a second end. The micro display panel 1410 is formed on one surface of the first end of the circuit board 1420 and electrically connected with the circuit board 1420. The support base 1430 is formed on the other surface of the first end of the circuit board 1420 opposite to the micro display panel 1410. The support base 1430 is made of a thermal interface material, so that the support base 1430 can provide support to the micro LED panel 1410 and transfer heat. A flash memory 1440 is formed on one surface of the second end of the circuit board 1420. In some embodiments, the flash memory 1440 is configured to store instruction for controlling the micro LED panel. Optionally, the flash memory 1440 and the micro display panel 1410 are formed on the same side of the circuit board 1420. It is noted that, the flash memory 1440 is electrically connected with the circuit board 1420. The connector 1450 is formed on the other surface of the second end of the circuit board 1420 opposite to the flash memory 1440 and electrically connected with the circuit board 1420 and the flash memory 1440. The connector 1450 is configured to connect the circuit board 1420 to a micro LED display device. In some embodiments, the micro LED display device is a wearable device, such as a pair of smart glass. Additionally, the connector 1450 and the support base 1430 are formed on the same side of the circuit board 1420. In some embodiments, the micro display panel 1410 and the flash memory 1440 are on the same side of the surface of the circuit board 1420. In some embodiments, the support base 1430 and the connector 1450 are on the same side of the surface of the circuit board 1420. In some embodiments, an edge of the micro display panel 1410, an edge of the support base 1430, an edge of the flash memory 1440, and an edge of the connector 1450, do not exceed an edge of the circuit board 1420. That is, the micro display panel 1410, the support base 1430, the flash memory 1440, and the connector 1450 provided on the circuit board 1420 are within the boundary of the circuit board 1420. In some further embodiments, a central processing unit 1460 is formed between the connector 1450 and the circuit board 1420. The central processing unit 1460 is used for processing the acquired image data from external input devices, for example, a camera, a video recording device, or any image or video capturing device that is currently know or developed in the future. In some embodiments, a cooling element 1470 is formed on the back of the support base 1430 to transfer heat from the micro display panel 1410 to the support base 1430 or disseminate the heat. In some embodiments, the cooling element 1470 is a currently-known or future-developed liquid cooling system or liquid cooling element. In some embodiments, the cooling element 1470 is a solid cooling element that is physically attached to the support base 1430. In some embodiments, the support base 1430 and the cooling element 1470 are non-conductive, and are not electrically coupled with the circuit board 1420.

Figure 9:
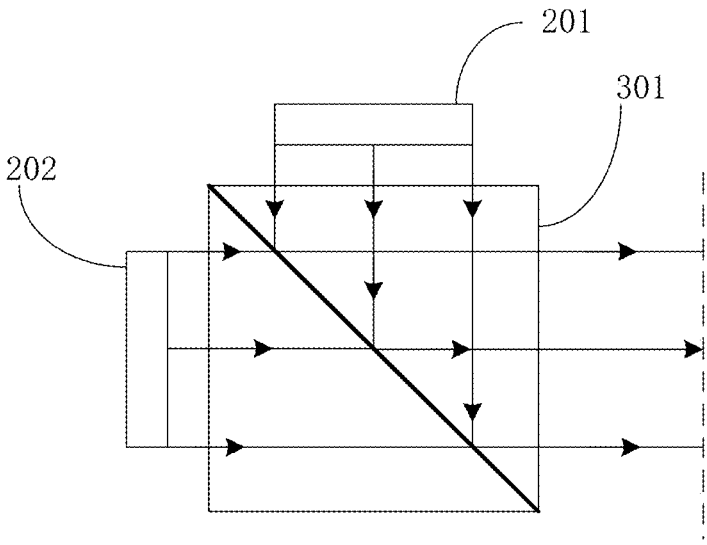
FIG. 9 is a structure diagram of a micro LED projector according to a first embodiment of the present disclosure.

In some embodiments consistent with FIGS. 9 and 10, the minimum distance between the micro LED panel 201, 202 or 203 and the surface of the X-cube 301 facing to the micro LED panel 201, 202 or 203 is not greater than twice of the thickness of the micro LED panel 201, 202 or 203; preferably, the minimum distance between the micro LED panel 201, 202 or 203 and the surface of the X-cube 301 facing to the micro LED panel 201, 202 or 203 is not greater than 2 mm, preferably, not greater than 1 mm. The dimension of the X-cube 301 is decided by the active emitting areas of the micro LED panels 201, 202, and 203, and the light area on the X-cube 301 surface which is formed by the rays emitted from the micro LED panel 201, 202 or 203. The X-cube 301 is a cube structure with six surfaces having the same area. The active emitting areas of the micro LED panels 201, 202, and 203 are the same. Each of the surface area of the X-cube 301 can be less than the active emitting area, that is to say, the width of the active emitting area can be the same as or greater than the width of the surface of the X-cube 301; the height of the active emitting area can be the same as or greater than the height of the surface of the X-cube 301. In some embodiments, each of the surface area of the X-cube 301 is not less than the light area, that is to say, the width of the light area can be the same as or less than the width of the surface of the X-cube 301; the height of the light area can be the same as or less than the height of the surface of the X-cube 301. For example, in some embodiments, the light area on a surface of the X-cube 301 is a circle with a diameter 3 mm and the surface is facing to the micro LED panel 201, so the surface area of the X-cube 301 facing to the micro LED panel 201 is 3 mm×3 mm. Furthermore, the light area is not greater than the active emitting area. When the chief ray angle of the micro LED panel 201, 202 or 203 is 0°, that is to say, the chief ray angles of all of the micro LED structure in the micro LED panel 201, 202 or 203 is 0°, the surface area of the X-cube 301 is not less than the active emitting area and preferably not greater than 200% of the active emitting area, as shown in FIGS. 9 and 10. It is noted that, when the chief ray of the micro LED structures in the micro LED panel 201, 202 or 203 is collimated into one point, the light area is less than the active emitting area; when the chief ray of the micro LED structures in the micro LED panel 201, 202 or 203 is divergent around, instead of being collimated into one point, the light area of the X-cube 301 is greater than the active emitting area.

Figure 15:
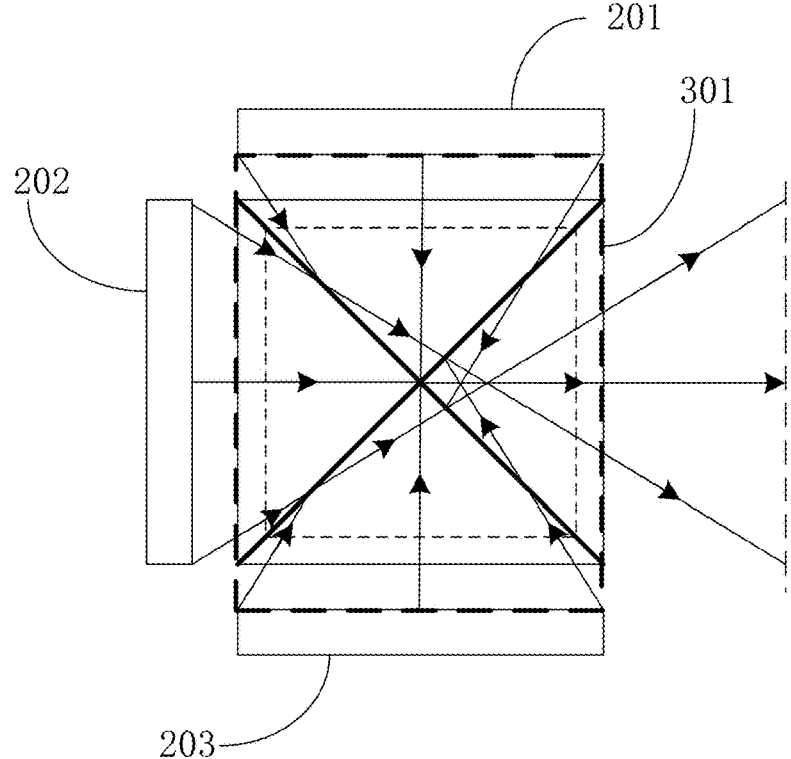
FIG. 15 is a structure diagram of a micro LED projector according to a first embodiment of the present disclosure.
Figure 16:
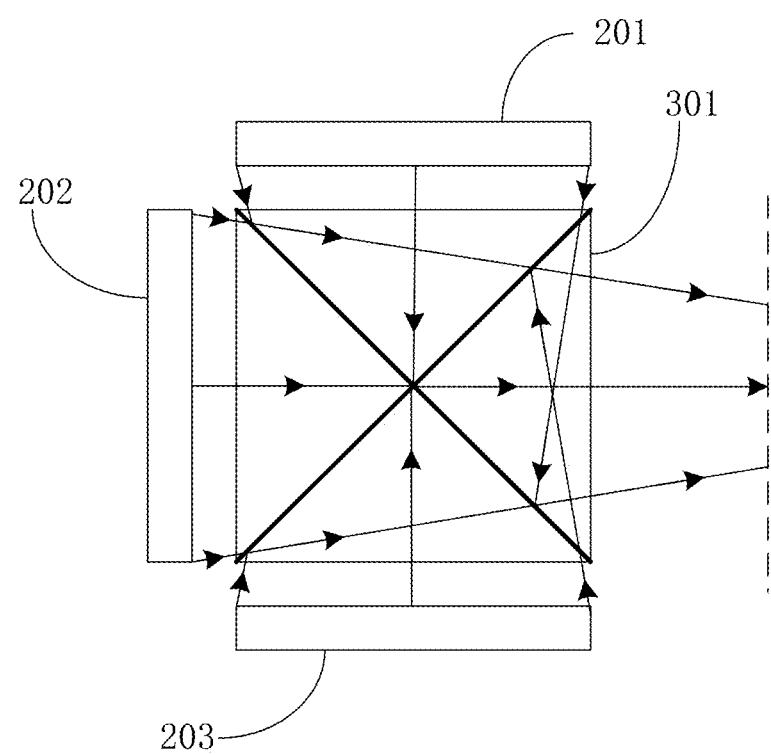
FIG. 16 is a structure diagram of a micro LED projector according to a first embodiment of the present disclosure.
Figure 17:
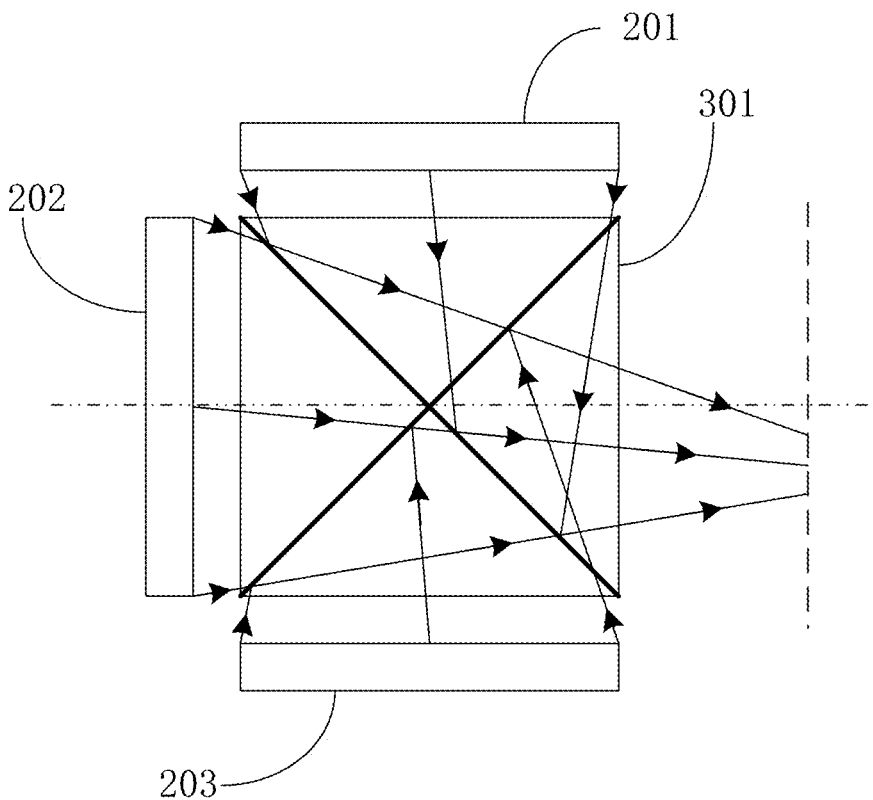
FIG. 17 is a structure diagram of a micro LED projector according to a first embodiment of the present disclosure.

In some embodiments consistent with FIGS. 15-17, when the chief ray angle of at least several micro LED structures in the micro LED panel 201, 202 or 203 is larger than 0°, the surface area of the X-cube 301 is not less than the light area and preferably not greater than 200% of the active emitting area. In some embodiments consistent with FIG. 15, the dotted square illustrating the minimized X-cube, the surface area of which is equal to the light area; herein, the center chief ray angle of the micro LED panel 201, 202 or 203 is 0°. The chief ray angles of the micro LED structures in the micro LED panel 201, 202 or 203 are increased from the center of the micro LED panel 201, 202 or 203 to the edge of the micro LED panel 201, 202 or 203, so that the rays are collimated at a point into the X-cube 301 and transmits out of the X-cube 301 to display a reversed image on an interface (the dotted line). In some embodiments consistent with FIG. 16, the center chief ray angle of the micro LED panel 201, 202 or 203 is 0°; the chief ray angles of the micro LED structures in the micro LED panel 201, 202 or 203 are less than that in FIG. 15, so that the rays is collimated at a point which is out of the X-cube 301; and the rays transmit out of the X-cube 301 to display a minimized image on the interface (the dotted line). In some embodiments consistent with FIG. 17, the chief ray angle of the center of the micro LED array in the micro LED panel 201, 202 or 203 is larger than 0°, so that the center of the image on the interface (the dotted line) is not aligned with the center of the X-cube 301; herein, as shown in FIG. 17, the image is shifted down below the center axis of the X-cube 301. Additionally, because the chief ray angle of the micro LED structures in the micro LED panel 201, 202 or 203 are various, the dimension of the X-cube 301 can be decreased compared with the X-cube 301 in the embodiments consistent with FIGS. 9 and 10, in which the chief ray angle of the whole micro LED panel is 0°.

In some further embodiments, the three micro LED panels 201, 202, and 203 are vertically arranged around the X-cube 301. In some embodiments consistent with FIG. 15 again, a virtual rectangle (the large dotted rectangle in FIG. 15) is formed by the top side of the two micro LED panels 201 and 203, which are facing to each other. The diagonal length of the top surface of the X-cube 301 is not greater than 200% of the diagonal length of the virtual rectangle and not less than the diagonal length of the minimized square (the small dotted square in FIG. 15), preferably, not less than the top length of the active emitting area.

Figures 18, 19:
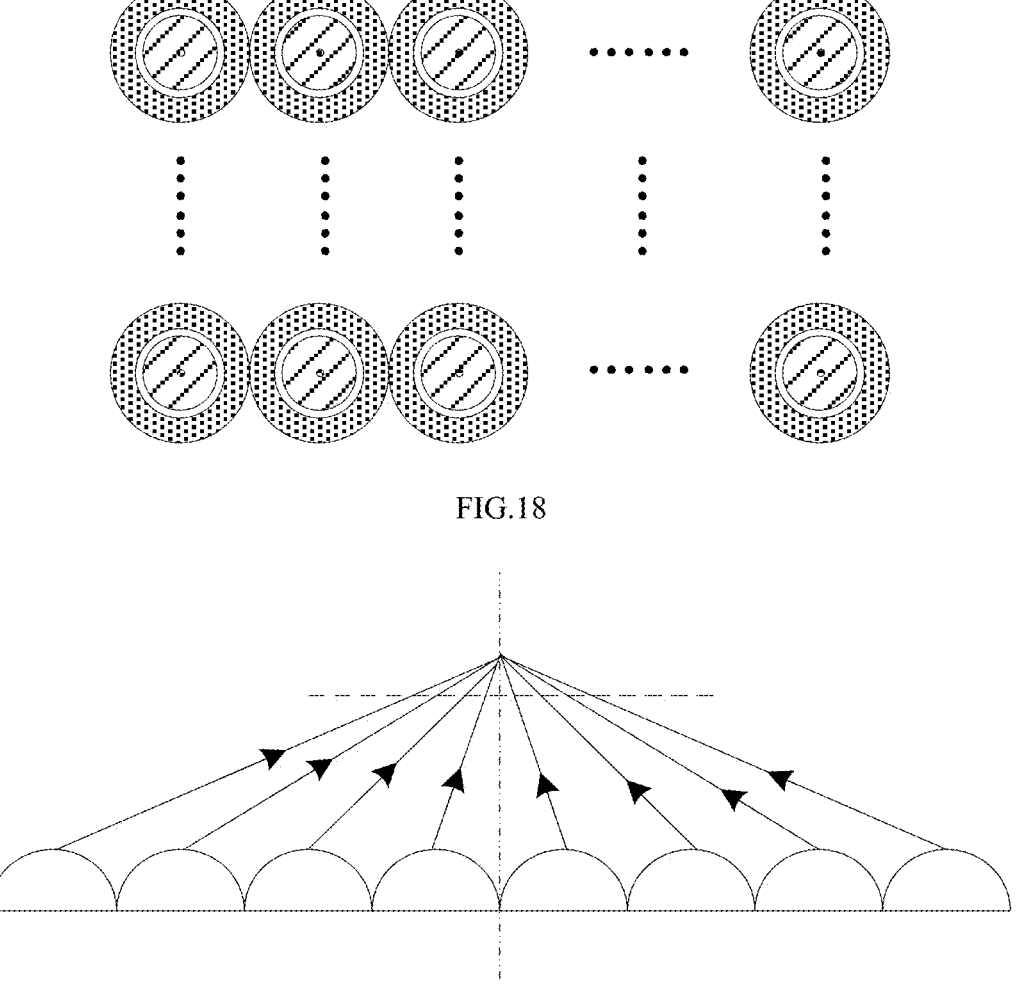
FIG. 18 is a structure diagram of a micro LED panel according to a first embodiment of the present disclosure.
FIG. 19 is a structure diagram of a micro LED panel according to a first embodiment of the present disclosure.

In some embodiments consistent with FIG. 18, in which ellipsis dots represent multiple micro LED structures, multiple micro LED structures are arranged in an array to form the micro LED array, which is used as the light emitting area of the micro LED panel. In the micro LED panel, referring to some embodiments consistent with FIG. 19, illustrating a cross sectional view of the micro LED array, wherein the number of the micro LED structures is not real number; and, the semi-spheres represent micro LED structures with micro lens, the dotted line represents an interface and the arrow represents the chief ray from the micro LED structures. The chief ray angles of the micro LED structures are different. In some embodiments, the chief ray angles of the micro LED structures are increased from any point above the micro LED array to the edge of the micro LED array, such as from the center of the micro LED array to the edge of the micro LED array; therefore, the chief rays of the micro LED structures in the micro LED array can automatically be collimated at the point above the micro LED array, such as the point in the center axis of the micro LED array, as shown in FIG. 19; and, this micro LED array panel is also showed in FIGS. 15~17. Preferably, the chief ray angles of the micro LED structures are increased in a certain amount, such as 1°, or another. The certain amount is depended by the row number and the column number of the micro LED array and the dimension of the micro LED array. The chief ray angle can be changed by shifting the aforementioned reflective structure along the horizontal level; or, the chief ray angle can be changed by shifting the micro lens along the horizontal level in another embodiment, which can be referred to U.S. patent application Ser. No. 17/486,113.

It is noted that, the center axis of the micro LED array is an axis vertical to the micro LED array panel and across the symmetrical center. The horizontal level is parallel to the surface of the micro LED array panel, such as the top surface of the micro mesa structure. The chief ray angle is that the angel between the chief ray and the vertical direction.

In some further embodiments, a micro LED array panel can comprise multiple aforementioned micro LED structures formed into an array. The micro LED array panel is a micro self-emitting panel. In the micro LED array panel, one pixel is formed by at least one micro LED.

In some embodiments consistent with FIG. 8, the micro LED structures of the micro LED panel 201, 202, and 203 may be an organic LED or an inorganic LED. The light emitting area of the micro LED array panel 201, 202, and

203 is very small, such as 3 mm*5 mm. In some embodiments, the light emitting area is the area of the micro LED array in the micro LED panel. The micro LED array panel comprises a micro LED array that forms a pixel array, such as 1600×1200, 680×480, and 1920×1080. The diameter of the micro LED structure is in the range about 200 nm~2 μm. An IC back plane 07 is formed at the back surface of the micro LED array and electrically connected with the micro LED array. The IC back plane 07 acquires signals such as image data from outside via signal lines to control a corresponding micro LED to emit light or not. The IC back plane 07 generally employs an 8-bit Digital to analog converter (DAC). The 8-bit DAC has 256 levels of manifestations, and each level corresponds to one gray level, that is, the 8-bit DAC may provide 256 different gray levels. Since any one of the 256 gray levels may be applied on the micro LED, a gray level ranging from 0 to 255 may be displayed by one pixel. Optionally, a brightness value of the micro LED can be controlled by voltage amplitudes or current amplitudes of the signals acquired by the IC back plane, while the gray levels can be shown by time intervals, e.g., pulse widths, of the signals, which can be understood by those skilled in the art.

Embodiment 2

Figure 20:
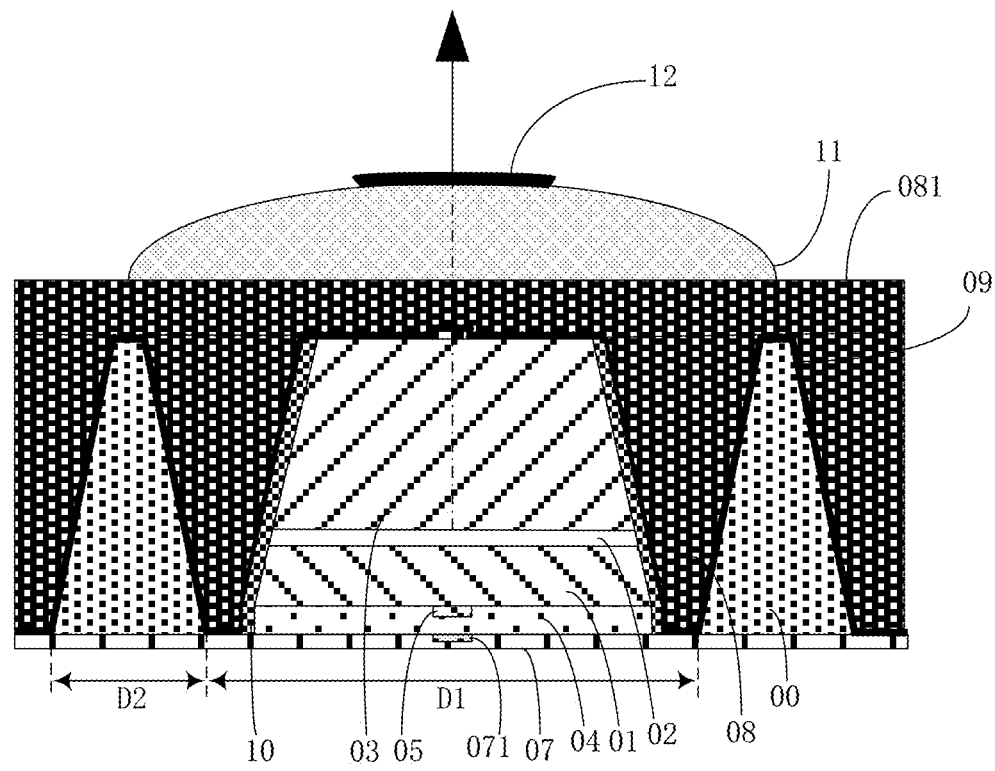
FIGS. 20~26 are structure diagrams of a micro LED structure according to a second embodiment of the present disclosure.

Referring to FIG. 20, the micro LED structure comprises: a mesa structure and a micro lens 11. Furthermore, the aforementioned reflective structure 00 can be formed around the mesa structure. The detail of the mesa structure and the reflective structure 00 can be referred to the description of Embodiment 1. Additionally, an antireflective film 12 is further formed on at least part of the surface of the micro lens 11.

Figure 21:
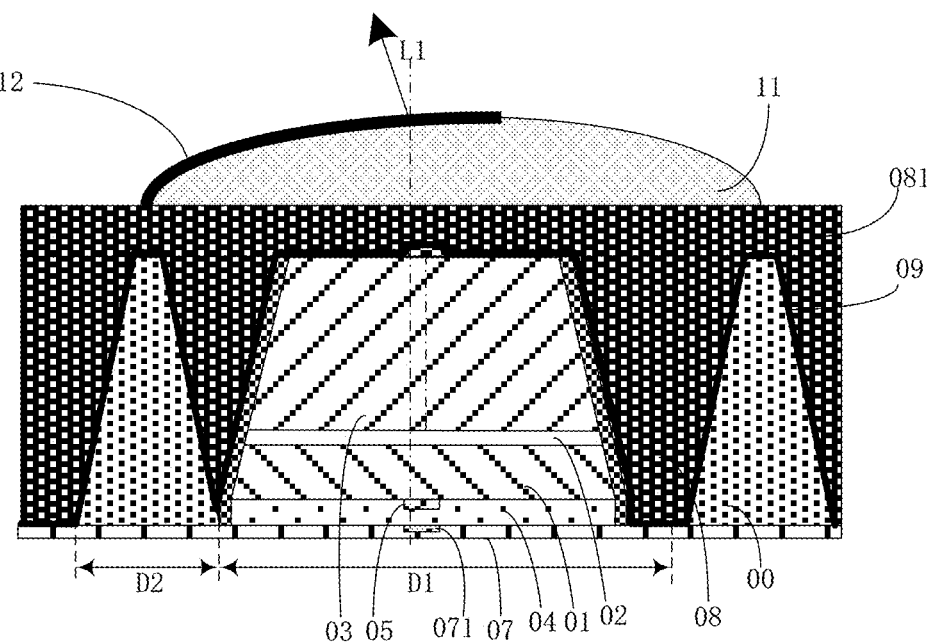

In some embodiments consistent with FIG. 20, the antireflective film 12 is formed on the emitting portion of the surface of the micro lens 11 where the ray emitted from. Herein, the chief ray of the micro LED structure is vertical to the top surface of the mesa structure and emitted from the top center of the micro lens 11. The antireflective film 12 is formed on the top of the micro lens 11. In some embodiments consistent with FIG. 21, the chief ray is inclined to the top surface of the mesa structure and emitted from the micro lens 11 at an angle in a range of 0~45° relative to the vertical direction. The antireflective film 12 is formed on part surface of the micro lens 11, as shown in FIG. 21.

Figure 22:
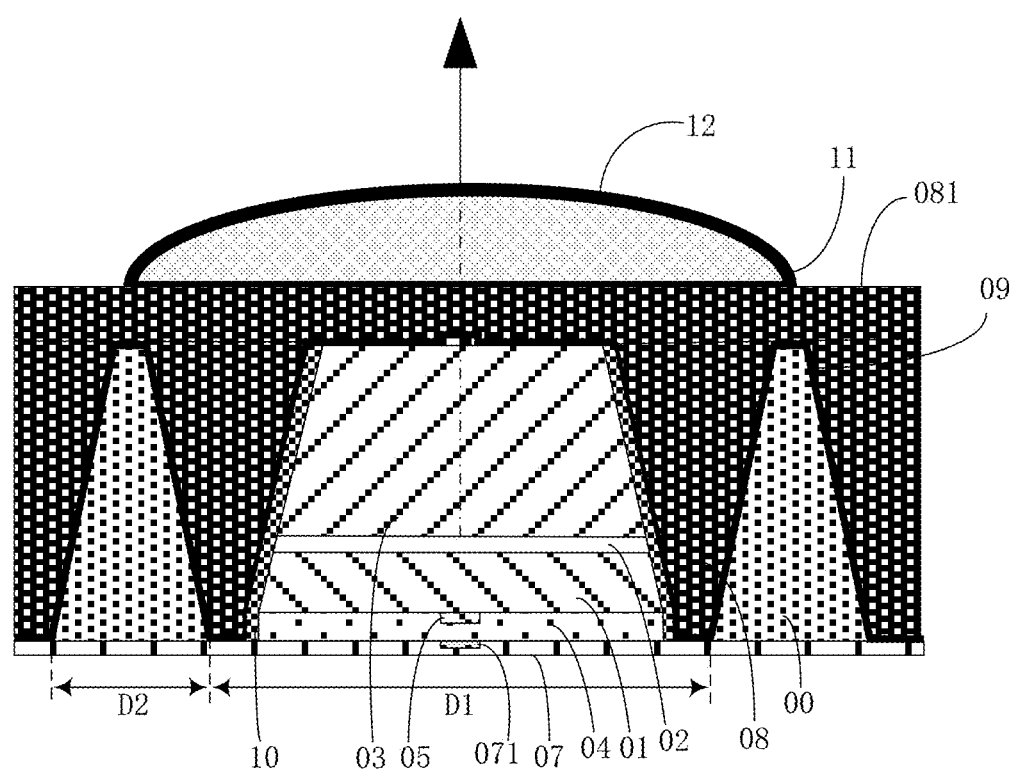
Figure 23:
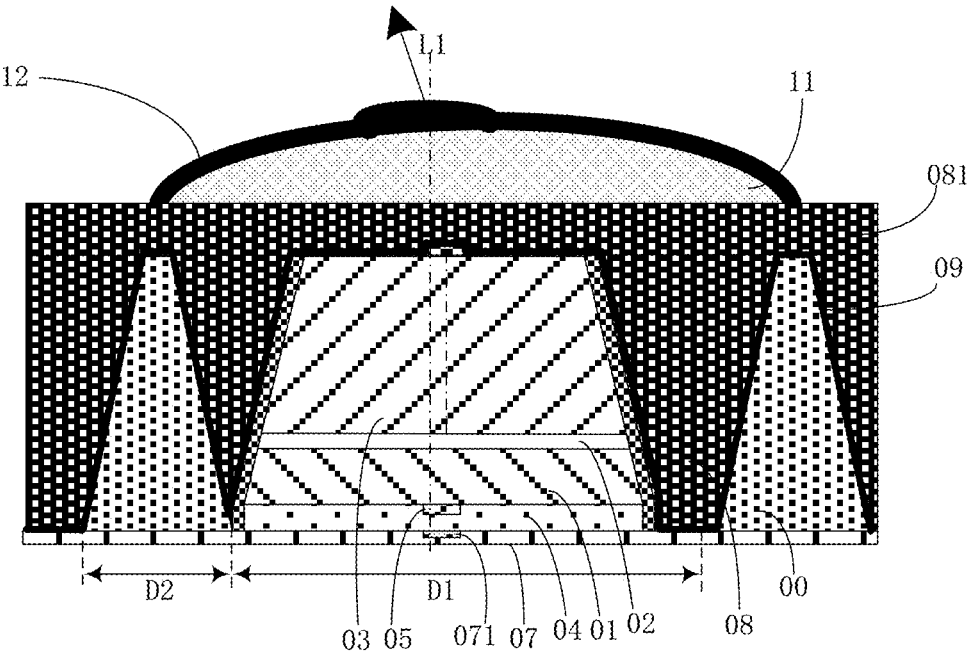

In some embodiments consistent with FIGS. 22 and 23, the antireflective film 12 can be formed on the whole micro lens 11 surface. The dielectric layer 08 is formed around the mesa structure and a spacer 081 is formed on the dielectric layer 08, the top of the mesa structure and the top of the reflective structure 00; and, the antireflective film 12 is further formed on the top of the spacer 081.

Preferably, as shown in FIG. 23, the thickness of the antireflective film 12 formed on the emitting portion is larger than the thickness of the antireflective film 12 formed on the other positions of the micro lens 11. Additionally, when the chief ray is vertical to the top surface of the mesa structure, the thickness of the antireflective film 12 on the top of the micro lens 11 is larger than the thickness of the antireflective film 12 on the other positions of the micro lens 11.

Due to the various chief ray angles of the emitting light by shifting the reflective structures or the micro lens, the optical loss of the ray in the micro lens 11 and on the surface of the micro lens 11 is produced and cannot be avoided. Therefore, the antireflective film 12 can improve the transmitting rate of the rays emitted from the micro lens 11, thereby increasing the light emitting efficiency of the micro LED structure. Preferably, the thickness of the antireflective film 12 is in the range of 1 nm~10 μm. And the dielectric constant of the antireflective film 12 is between the dielectric constant of the micro lens and the dielectric constant of the air. The material of the antireflective film 12 is polymer, inorganic oxide, or inorganic nitride. The inorganic oxide can be silicon oxide, $Al_2O_3$, or $TiO_2$. Furthermore, the inorganic nitride can be silicon nitride or aluminum nitride, such as $Si_3N_4$, $Al_3N_4$, etc. The antireflective film 12 is transparent with high transmitting efficiency. The shape of the antireflective film 12 can be conformal with the shape of the micro lens 11, that is to say, the curvature radius of the antireflective film 12 is the same as the radius of the micro lens 11. For example, the shape of the antireflective film 12 can be arc shaped, semi-sphere shaped, etc. It is noted that, in another embodiments, the shape of the antireflective film 12 can be a sphere with different radius compared with the micro lens 11. It is noted that, the antireflective film 12 can also be used as a protective layer to protect the surface of the micro lens 11 from being damaged.

In some embodiments, the chief ray angle of the micro LED structure can be changed by shifting reflective structure 00 as mentioned above or by shifting the micro lens 11 along the top surface of the mesa structure. For example, the center axis of the micro lens 11 is shifted from the center axis of the mesa structure, so as to change the chief ray angle of the micro LED structure.

The detail of the mesa structure, the reflective structure and the IC back plane 07 can be referred to the description of Embodiment 1.

Furthermore, the spacer 081 is formed at the bottom of the micro lens 11 and between the mesa structure and the micro lens 11. The thickness of the spacer 081 can be adjusted according to the actual requirement. Preferably, the thickness of the spacer 081 can be less than the curvature radius of the micro lens 11 in the embodiment. It is noted that, in another embodiment, the thickness of the spacer 081 is equal to or greater than the radius of the micro lens 11. The distance between the focal point of the micro lens 11 and the light emitting layer 02 is determined by the thickness of the spacer 081 and the radius of the micro lens 11. Preferably, the thickness of the spacer 081 is less than 50% of the radius of the micro lens 11. And, the thickness of the spacer is in the range of 10%~200% of the height of the micro lens.

It is noted that, the micro LED structure in the Embodiment 2 can also be applied in the micro LED projector as mentioned in the Embodiment 1.

Figure 24:
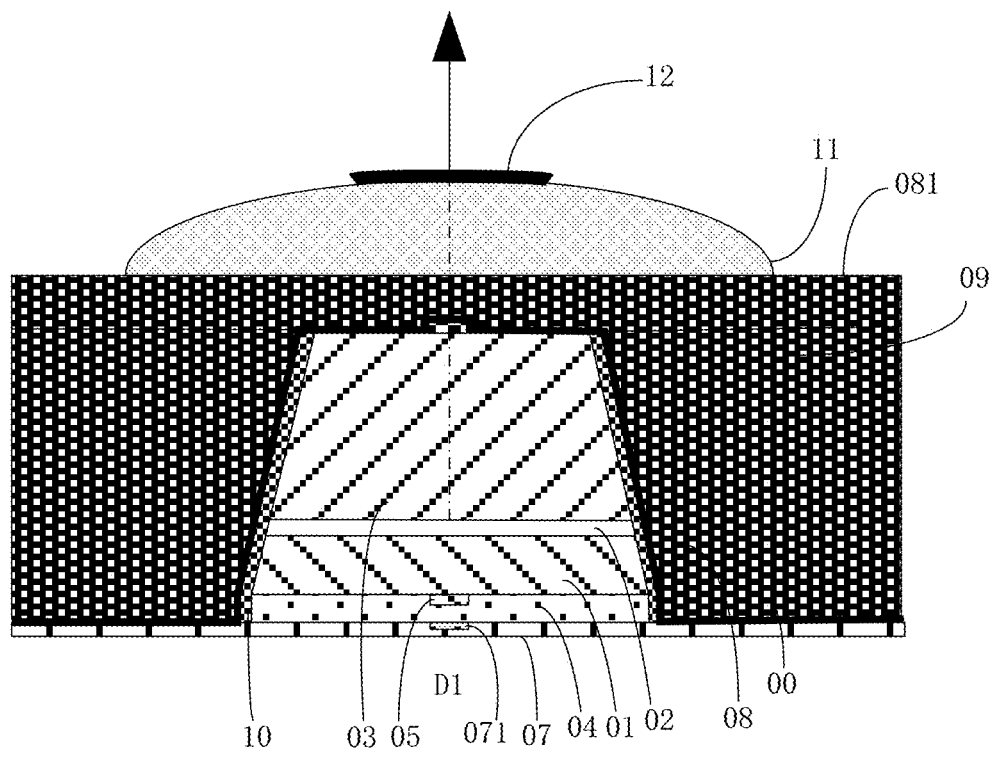
Figure 25:
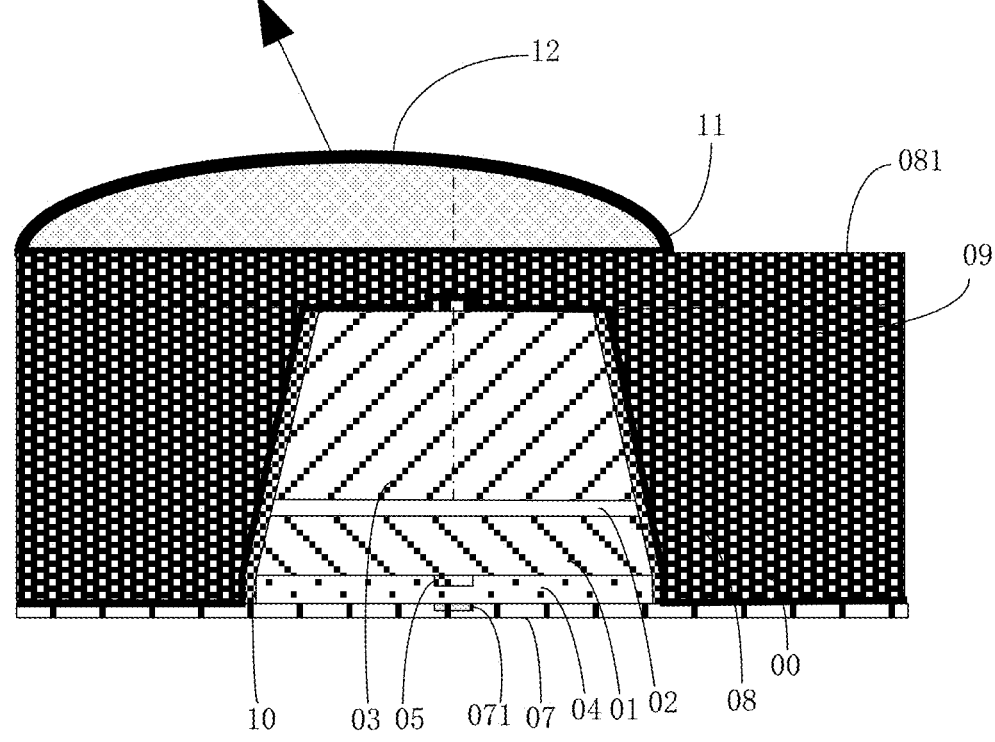
Figure 26:
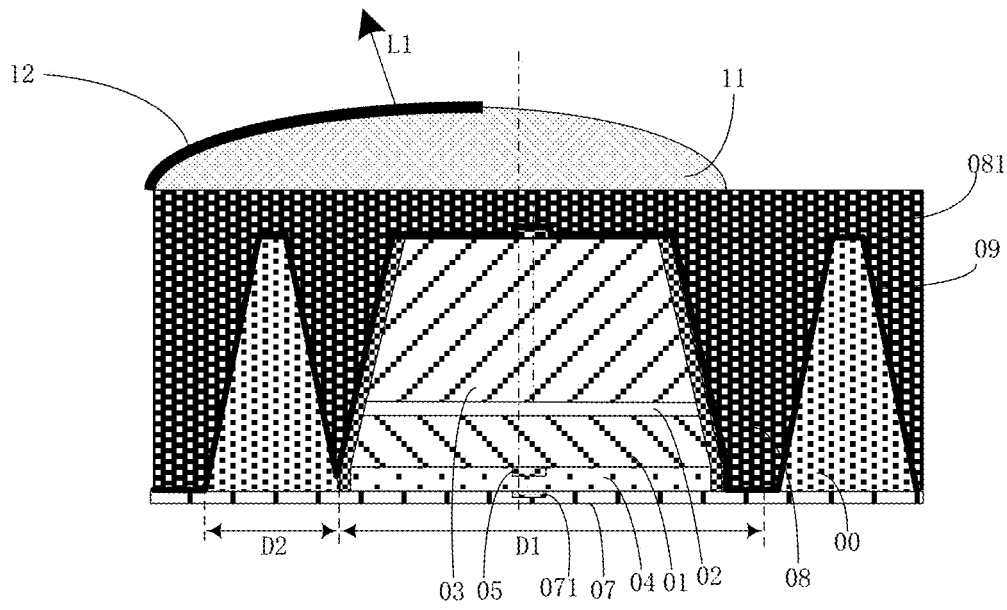

It is also noted that, the chief ray angle can be changed by shifting the micro lens 11 along the horizontal level in another embodiment, as shown in the embodiment consistent with FIGS. 24 and 25. Therefore, the reflective structure is not needed in these embodiments. And the chief ray angle can also be changed by both shifting the micro lens along the horizontal level and shifting the reflective structure 00 at the same time in the embodiments consistent with FIG. 26. Therefore, the reflective structure 00 and the micro lens 11 are both needed in these embodiments.

Embodiment 3

Figure 27:
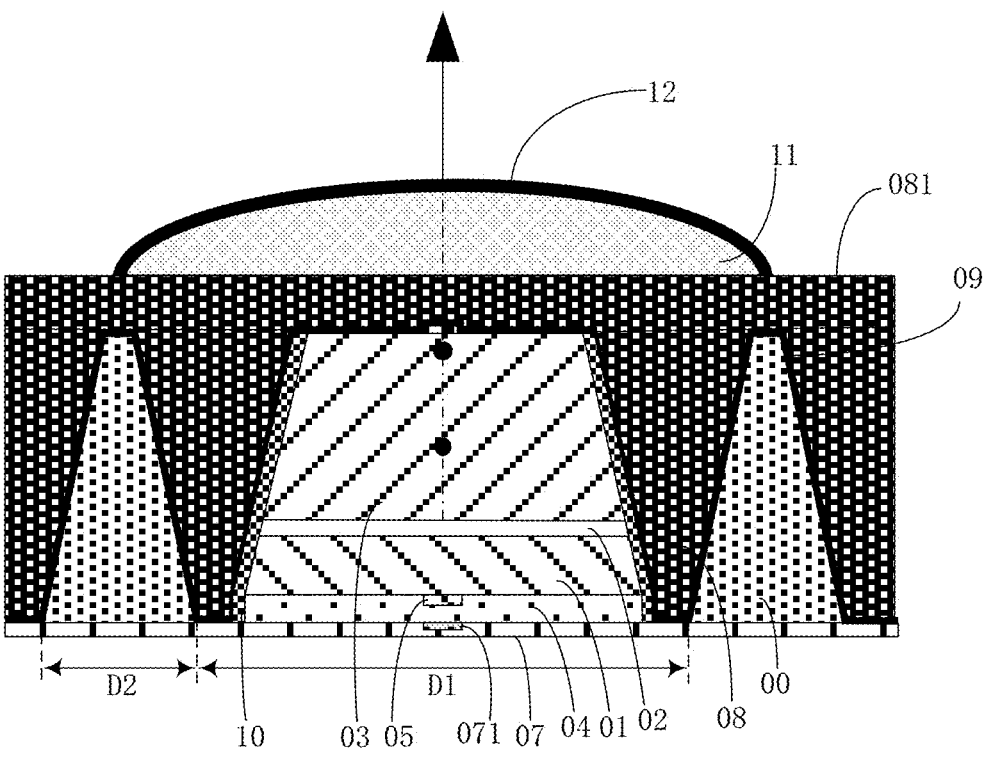
FIGS. 27~30 are structure diagrams of a micro LED structure according to a third embodiment of the present disclosure.

Referring to the embodiments consistent with FIG. 27, the micro LED structure comprises: a mesa structure and a micro lens 11. The micro LED structure further comprises the aforementioned reflective structure 00, the spacer 081, the isolation layer 10 and the dielectric layer 08. The detail of the mesa structure, the micro lens 11, the spacer 081, the isolation layer 10, the dielectric layer 08 and the reflective structure 00 can be referred to the Embodiments 1 and 2.

In some embodiments consistent with FIG. 27, the shape of the micro mesa structure is as follows: the top surface area of the micro mesa structure is less than the bottom surface area of the micro mesa structure, like a trapezoid. Furthermore, the distance between the focal point of the micro lens 11 and the top of the micro mesa structure is not greater than 70% of the height of the micro mesa structure, as shown in FIG. 27, the black dot representing the focal point position, which will be described hereinafter. Preferably, the curvature radius of the micro lens 11 is in the range of 100 nm~10 μm; and, the diameter of the micro lens 11 is greater than the top width of the micro mesa structure. It is noted that, if the chief ray angle of the micro LED structure is greater than 0°, the diameter of the micro lens 11 can be less than the top width of the micro mesa structure.

Figure 28:
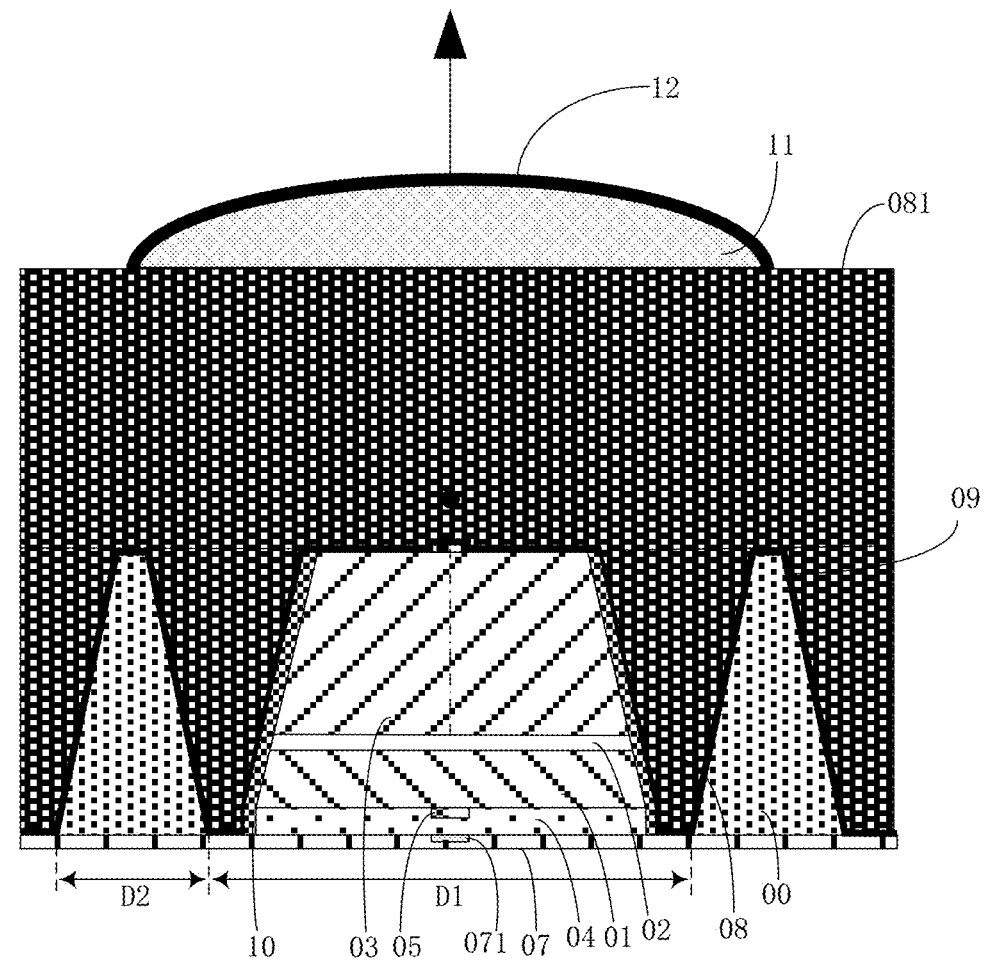
Figure 29:
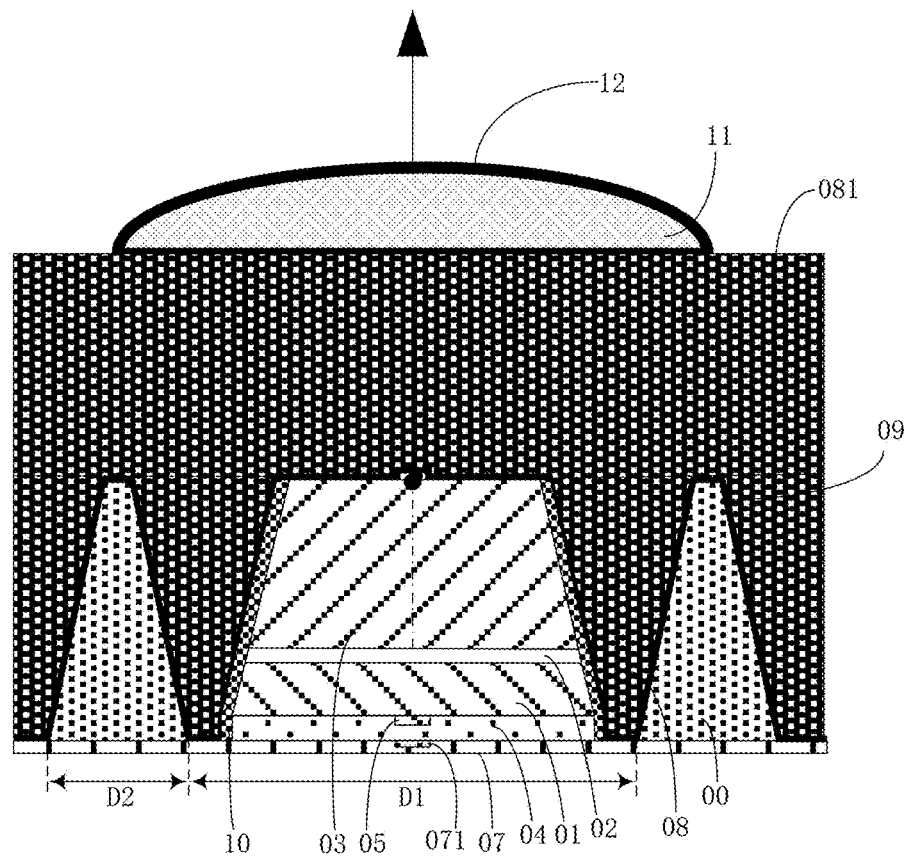

When the spacer 081 is formed between the micro lens 11 and the mesa structure, the position of the focal point of the micro lens 11 is decided by the thickness of the spacer 081, the height of the micro lens 11 and the curvature radius of the micro lens 11. In some embodiments consistent with FIG. 28, the black dot representing the focal point position, the thickness of the spacer 081 is greater than 100%~300% of the curvature radius, the position of the focal point is above the top surface of the micro mesa structure. In some embodiments consistent with FIG. 29, the black dot representing the focal point position, the thickness of the spacer 081 is around 100%~300% of the curvature radius, the position of the focal point is on the top surface of the micro mesa structure. In some embodiments consistent with FIG. 27, the thickness of the spacer 081 is less than 100%~300% of the curvature radius, the position of the focal point is below the top of the micro mesa structure.

Figure 30:
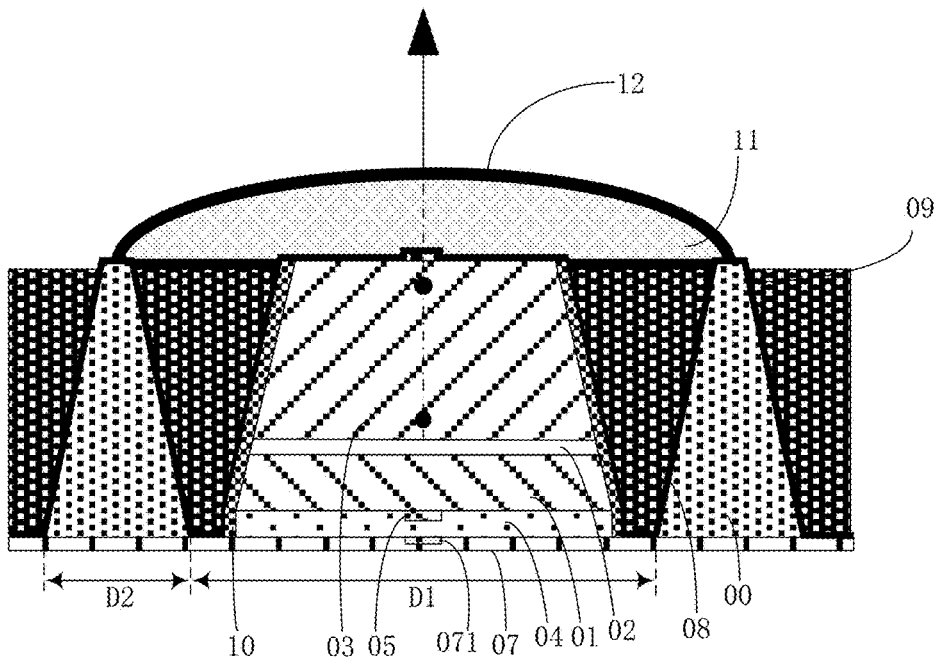

In some further embodiments, when the spacer is not formed between the mesa structure and the micro lens 11, the position of the focal point is determined by the curvature radius of the micro lens. In some embodiments consistent with FIG. 30, the black dot representing the focal point position, the curvature radius of the micro lens 11 is 50%~100% of the height of the mesa structure, the distance between the focal point of the micro lens 11 and the top of the micro mesa structure is not greater than 70% of the height of the micro mesa structure.

It is noted that, when the height of the micro lens 11 is kept at a preset value with the curvature radius of the micro lens 11 increasing larger, the focal point position will be moved down; furthermore, when the diameter of the micro lens 11 without the spacer 081 is greater than the bottom width of the mesa structure and the height of the micro lens 11 is less than the radius of the micro lens 11, the focal point position of the micro lens 11 can reach out of the bottom of the mesa structure. Additionally, when the diameter of the micro lens 11 is 100%~200% of the top width of the mesa structure, or is equal to the bottom width of the mesa structure, the distance between the focal point of the micro lens 11 and the top of the micro mesa structure is not greater than 70% of the height of the micro mesa structure. Preferably, the radius of curvature of the micro lens is in the range of 100 nm~10 μm.

Additionally, the surface roughness of mesa structure is another influence factor on the focal point position. The mesa structure causes light scattering on the surface of the micro lens 11 and the surface of the mesa structure, so the actual focal point of the micro lens 11 cannot reach too deep into the mesa structure. Preferably, the distance between the focal point of the micro lens 11 and the top of the micro mesa structure is not greater than 70% of the height of the micro mesa structure. In some embodiments, the distance between the focal point and the top surface of the mesa structure is at the 30% of the height of the micro mesa structure. Preferably, the surface roughness of the micro mesa structure is 1 nm~100 nm.

Preferably, the surface roughness of the micro lens 11 is in the range of 1 nm~100 nm. The material of the micro lens 11 is selected from polymer, inorganic oxide, and inorganic nitride. The inorganic material can be silicon oxide or silicon nitride. It is noted that, the material of the micro lens 11 can be different from the material of the spacer 081; or, in some embodiment, the material of the micro lens 11 can be the same as the material of the spacer 081.

Various light luminous and efficiency is determined at least by various focal point positions of the micro lens and the various chief ray angle of the micro LED structure.

It is noted that, the micro LED structure in the Embodiment 3 can also be applied in the micro LED projector as mentioned in the Embodiment 1.

More details of the micro LED structure can be referred to in the description of the Embodiments 1 and 2.

Embodiment 4

Figure 31:
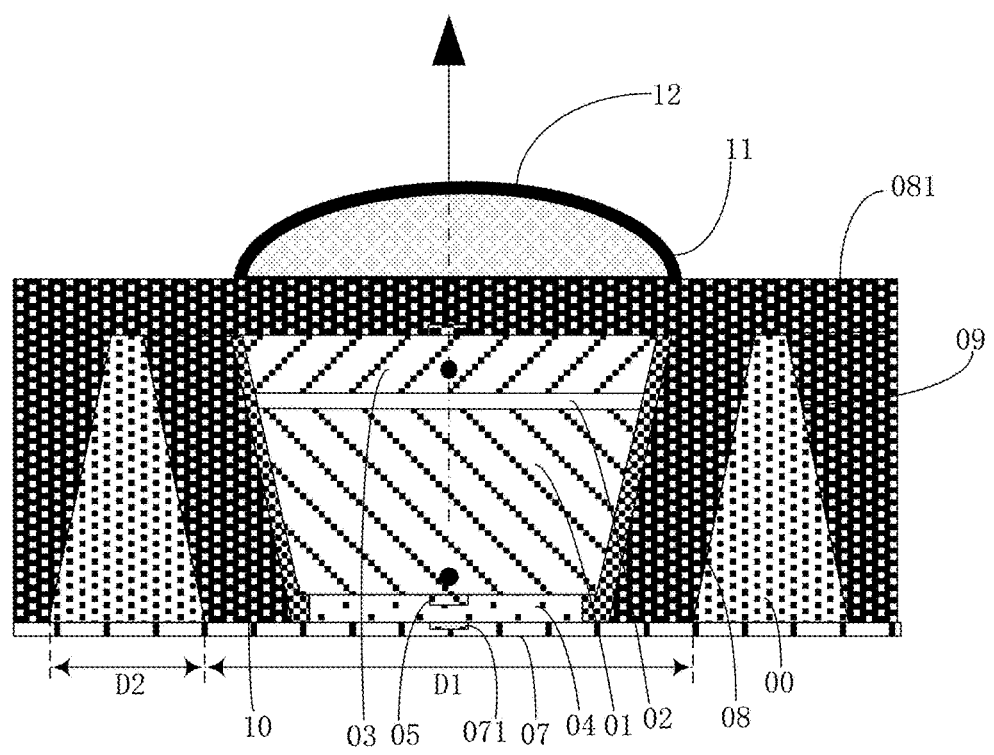
FIG. 31 is a structure diagram of a micro LED structure according to a fourth embodiment of the present disclosure.

Referring to the embodiments consistent with FIG. 31, the mesa structure is different from that of the Embodiment 3. The mesa structure in the Embodiment 4 is as follows: the top surface area of the micro mesa structure is greater than the bottom surface area of the micro mesa structure, like a reversed trapezoid.

Additionally, as mentioned above, the surface roughness of the micro lens 11 and the surface roughness of mesa structure are additional influence factors on the focal point position. The surface roughness of the micro lens 11 and the mesa structure causes light scattering on the surface of the micro lens 11 and the surface of the mesa structure, so the actual focal point of the micro lens 11 cannot reach too deep into the mesa structure. Preferably, the surface roughness of the micro lens is in the range of 1 nm~1000 nm. Thus, the distance between the focal point of the micro lens 11 and the top of the micro mesa structure is not greater than 100% of the height of the micro mesa structure, which is not different from that of the Embodiment 3. In the reversed-trapezoid-like micro LED structure, the curvature radius of the micro lens 11 may be greater than that in the trapezoid-like micro LED structure in the Embodiment 3, so the focal point position may be deeper into the mesa structure compared with the focal point of the Embodiment 3. When the diameter of the micro lens 11 is 80%~120% of the top width of the reversed-trapezoid mesa structure or is equal to the bottom width of the mesa structure, the distance between focal point of the micro lens 11 and the top of the reversed-trapezoid micro mesa structure is not greater than 100% of the height of the reversed-trapezoid micro mesa structure. Preferably, the radius of curvature of the micro lens 11 is in the range of 100 nm~10 km.

It is noted that, the micro LED structure in the Embodiment 3 can also be applied in the micro LED projector as mentioned in the Embodiment 1.

Other details of the micro LED structure can be referred to in the description of the Embodiments 1~3.

Embodiment 5

A micro LED projector is provided in the Embodiment 5. In some embodiments consistent with FIG. 32, the micro LED projector comprises: a micro LED panel and a collimator unit 14. The micro LED panel comprises a micro LED structure array, which comprises multiple aforementioned micro LED structures; it is noted that, in the embodiments consistent with FIG. 32, only illustrating one micro LED structure for description of the Embodiment 5, which will not be limited to the scope of the present disclosure. The collimator unit 14 is formed in the light emitting direction, so as to collimate the rays emitted from the micro LED structure to a preset objective position, such as a display screen, a wall, or human eyes, which is not shown in FIG. 32.

Figure 32:
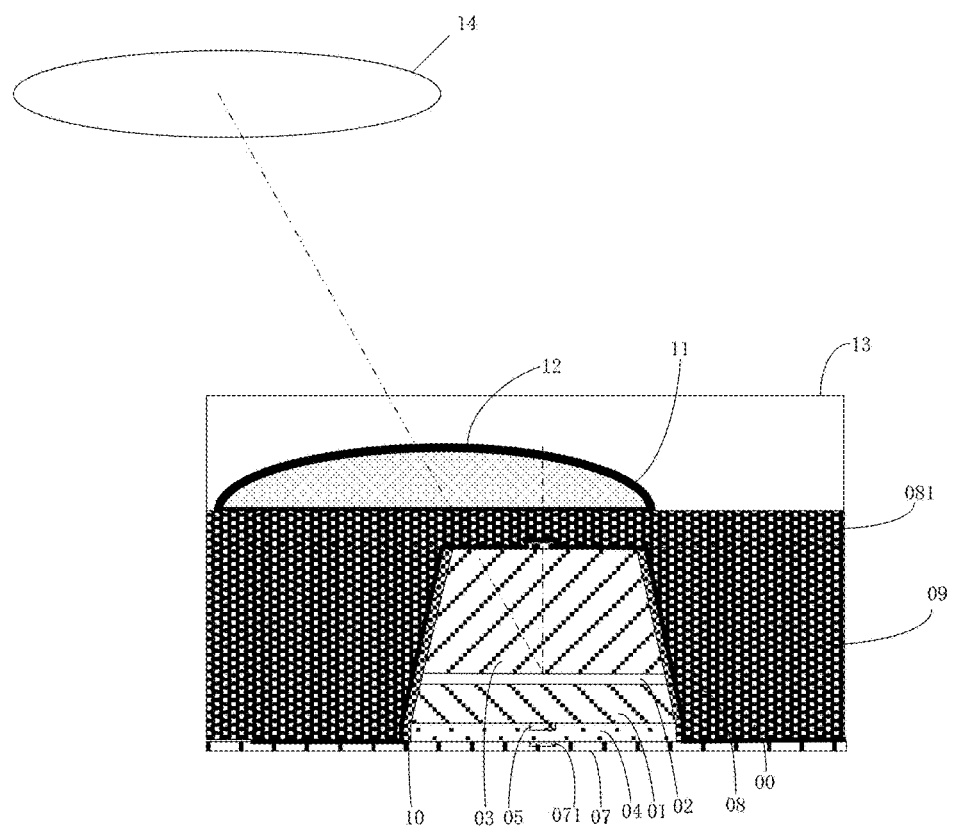
FIGS. 32~34 are structure diagrams of a micro optical engine according to a fifth embodiment of the present disclosure.
Figure 33:
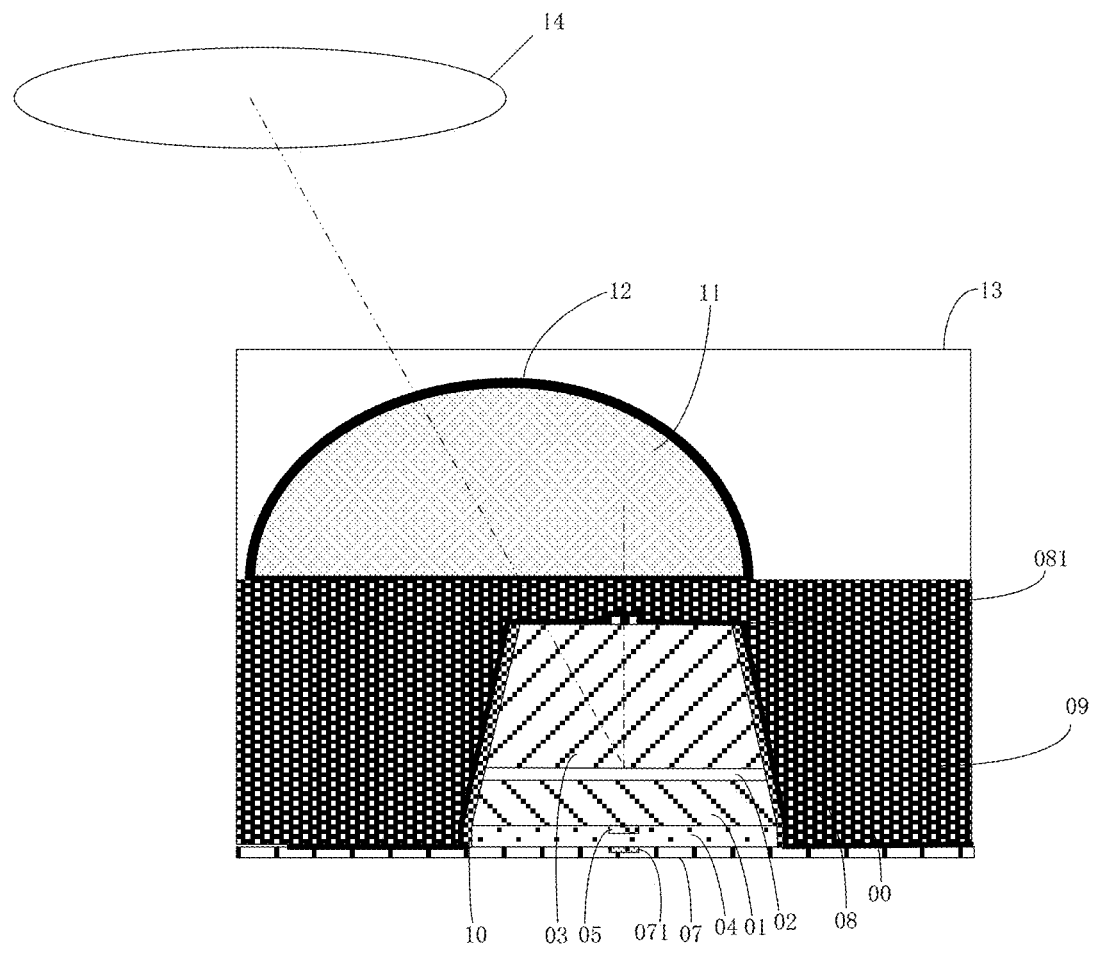
Figures 34, 35:
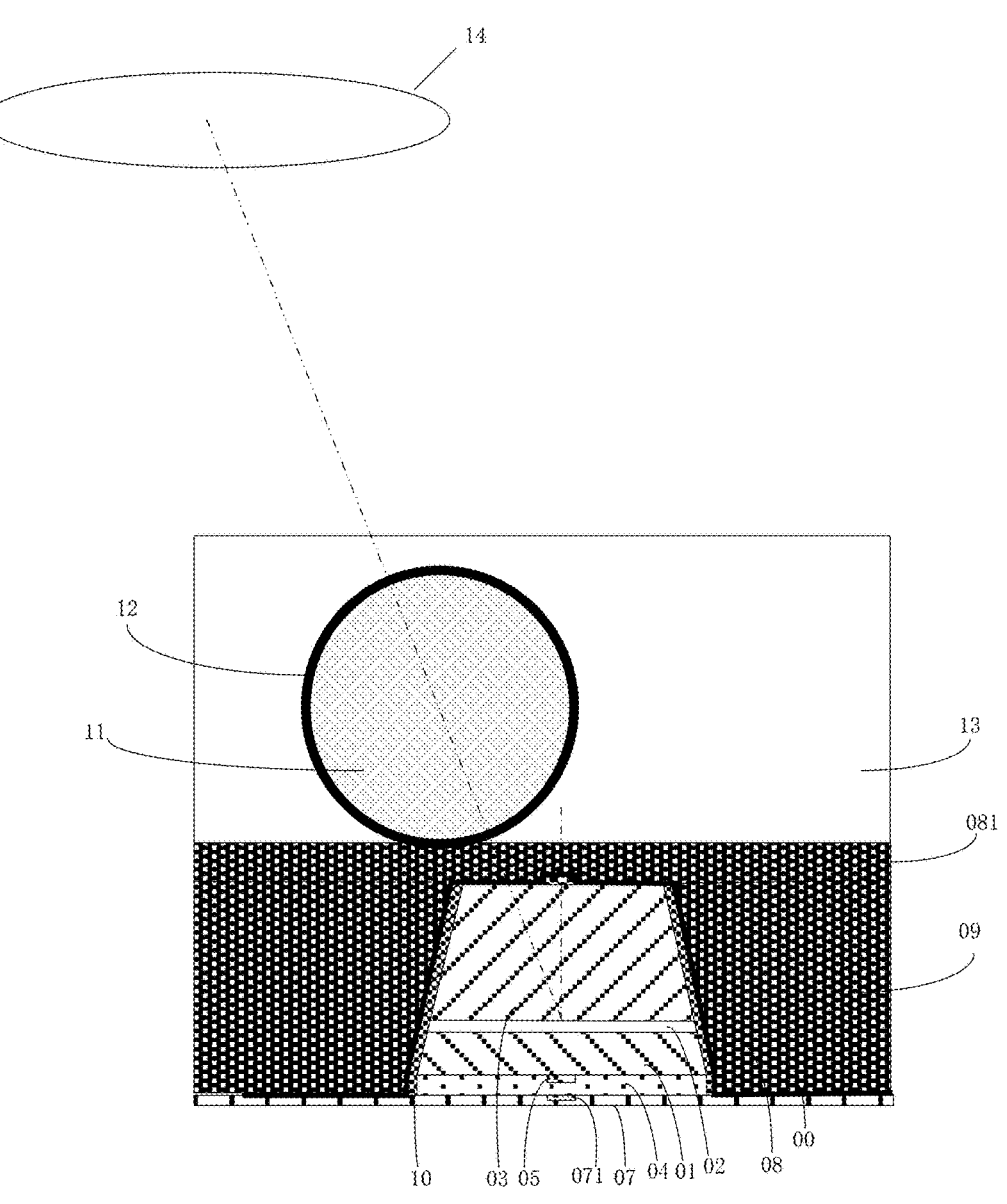
FIGS. 35~37 are structure diagrams of a micro LED projector according to a fifth embodiment of the present disclosure.

Herein, in some embodiments consistent with FIGS. 32~34, in each of the mesa structure, the center of the micro lens 11 and the center of the light emitting layer 02 are positioned on a first straight line. It is noted that, in some embodiments, the center of the collimator unit 14 is formed to be deviated from the first straight line. The center of the collimator unit 14 and the center of the light emitting layer 02 are positioned on a second straight line. The second straight line can be aligned with or deviated from the first straight line by a certain deviated angle. Preferably, the deviated angle is not greater than 5°.

In some embodiments, a connected straight line connects the center of the collimator unit 14, the center of the micro lens 11, and the center of the light emitting layer 02. Additionally, the center of the light emitting layer 02 can be horizontally deviated from the connected straight line. Preferably, the deviated distance of the center of the light emitting layer 02 horizontally deviated from the connected straight line is not greater than 45% of the bottom width of the mesa structure. In some embodiments, the bottom width of the mesa structure is 1 μm, the deviated distance of the center of the light emitting layer 02 is not greater than 0.3 μm.

The shape of the micro lens 11 can be a semi-sphere, a sphere, or another irregular shape. The center of the micro lens 11 can be a center of a semi-sphere or a sphere or a geometrical center of the irregular shape, such as a combination of a semi-sphere and a parabola; or, a combination of at least two semi-spheres with different diameters; or, a combination of at least two arc lines with different curvature radius.

In some embodiments, the micro LED structure further comprises a capping layer 13 covering the micro lens 11 and above the micro mesa structure. The material of the capping layer 13 is polymer, or inorganic oxide, or inorganic nitride, such as silicon oxide or silicon nitride. Furthermore, the capping layer 13 is also deposited between the adjacent micro lens 11.

Herein, the distance between the focal point of the micro lens 11 and the light emitting layer 02 is not greater than 200% of the thickness of the mesa structure.

Other details of the micro LED structure can be referred to in the description of the Embodiments 1~4.

It should be noted that, other elements may be formed between the micro LED structure and the collimator 14, such as optical combination element, which will be shown and described hereinafter.

Additionally, in some embodiments consistent with FIG. 35, the collimator unit 14 as shown in FIGS. 32~34 is a collimator group. Herein, a micro LED projector comprises a micro LED panel 15 and a collimator group 1400. The collimator group 1400 includes multiple lens for displaying the light image. Preferably, the number of the lens is not more than six; and the focal length of the collimator group 1400 is less than 2.5. Furthermore, the micro LED panel is formed to not contact the collimator unit 14 (the collimator group 1400). The distance between the micro LED panel and the surface of the collimator unit 14 (the collimator group 1400) is not greater than the thickness of the collimator unit 14 (the collimator group 1400). Preferably, the distance between the micro LED panel and the surface of the collimator unit 14 (the collimator group 1400) is not greater than 2 mm. The micro LED panel 15 has a light emitting area and the collimator unit 14 has an input surface. The light emitted from the light emitting area enters into the input surface of the collimator unit 14. Herein, the light emitting area is greater than the input surface of the collimator unit 14. Furthermore, the width of the micro LED panel 15 is greater than the diameter of the input surface of the collimator unit 14, reducing the volume and the weight of the micro LED projector. It is noted that, the LED structure comprises two or more of the micro LED panel. It is further noted that, the aforementioned light area of the collimator unit 14 equals to or is less than the input surface of the collimator unit 14.

Herein, the chief ray angles of the micro LEDs in the micro LED panel 15 are not same. It is note that, in some embodiments, the chief ray angles of some micro LEDs are same with each other and the chief ray angles of some micro LEDs are different from each other. Preferably, the chief ray angle of the micro LEDs in the micro LED panel 15 are collimated into a point.

Additionally, at least two kinds of color micro LED panel, each of the micro LED panel emitting one color ray, and the chief ray angles of the micro LEDs in each of the micro LED panel are collimated into a point. Furthermore, the micro LED projector further comprises an optical combination element, facing the color ray emitting directions of each color of the micro LED panels, formed to combine the color rays into a combined ray. The collimated light emits from an output surface of the optical combination element and then enters into an input surface of the collimator unit. Herein, the area of the output surface is greater than the area of the input surface. Furthermore, the diameter of the collimator unit is less than the side width of the optical combination element. Furthermore, the distance between the output surface of the optical combination element and the input surface of the collimator unit is not more than 200% of the thickness of the collimator unit. In some embodiments, the distance between the output surface of the optical combination element and the input surface of the collimator unit is zero.

Furthermore, the optical combination element has several receiving surfaces corresponding to each of the light emitting areas of the micro LED panels, respectively. Preferably, the minimum distance between the micro LED panel and the receiving surface of the optical combination element is not greater than 200% of the thickness of the micro LED panel. Additionally, the side width of the receiving surface of the optical combination element is less than the side width of the light emitting area of the first color micro LED panel.

Figure 36:
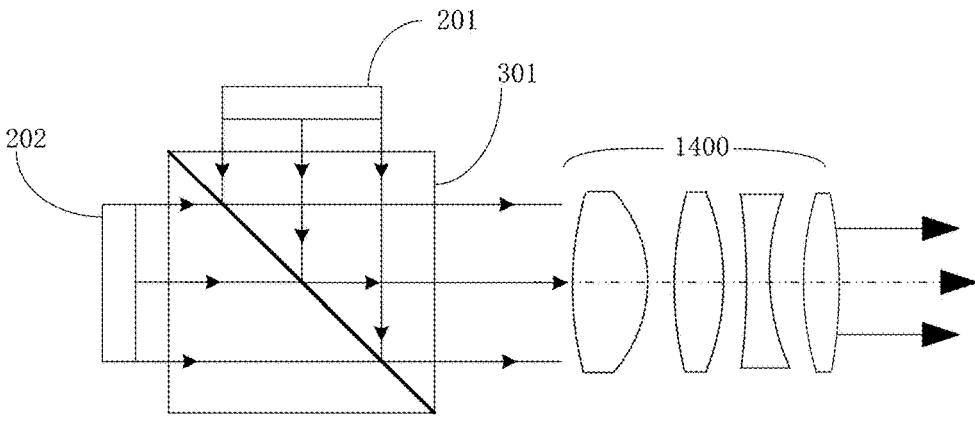

Herein, the micro LED structure in the Embodiment 5 can also be applied in a micro LED projector. In some embodiment consistent with FIG. 36, the micro LED projector of the Embodiment 5 orderly comprises: a first color micro LED panel 201, a second color micro LED panel 202, an optical combination element 301, and the collimator group 1400, wherein the first color is different from the second color. It is noted that, the collimator unit 14 comprises the collimator group 1400 or an optical lens.

The optical combination element 301 faces the first color ray emitting direction of the first micro LED panel 201 and faces the second color ray emitting direction of the second micro LED panel 202, combining the first color ray and second color ray into a combined ray. Then, the collimator group 1400 collimates the combined ray to a preset objective position, which is not shown in FIG. 36. The preset objective position can be a display screen, a wall, or human eyes.

The first micro LED panel 201 emits a first color ray, wherein, the first micro LED panel 201 comprises a first color micro LED structure array and the first color micro LED structure array comprises multiple first color micro LED structures. The first color micro LED structure is selected from the aforementioned micro LED structure with a first color light emitting layer. The second micro LED panel 202 emits a second color ray, wherein, the second micro LED panel 202 comprises a second color micro LED structure array and the second color micro LED structure array comprises multiple second color micro LED structures. The second color micro LED structure is selected from the aforementioned micro LED structure with a second color light emitting layer. The optical combination element 301 is formed to receive rays emitted from the first micro LED panel 201 and the rays emitted from direction of the second micro LED panel 202. Additionally, the optical combination element 301 comprises a polarizing spectroscopic film, facing the first color ray emitted from the first micro LED panel 201 and the second color ray emitted from the second micro LED panel 202. The collimator group 1400 receives the rays from the optical combination element 301 and collimates the rays to the preset objective position. It is noted that, the first micro LED panel 201 may emits two color rays and the second micro LED panel 202 may emit one color ray in another embodiments. In some embodiments, the optical combination element 301 is formed to receive rays emitted from the first micro LED panel 201 and the rays emitted from direction of the second micro LED panel 202. Additionally, the optical combination element 301 comprises a polarizing spectroscopic film, facing the rays emitted from the first micro LED panel 201 and the rays emitted from the second micro LED panel 202. Preferably, the optical combination element 301 is an X-cube. The structure of the X-cube can be understood by a person skilled in the field.

Furthermore, the collimated light emits from an output surface of the optical combination element 301 and then enters into an input surface of the collimator unit 14 (the collimator group 1400). The distance between the output surface of the optical combination element 301 (X-cube) and the input surface of the collimator unit 14 (the collimator group 1400) is greater than or equals to zero. Preferably, the distance between the output surface of the optical combination element 301 and the input surface of the collimator unit 14 is not greater than 200% of the thickness of the collimator unit.

Additionally, the chief ray angles of the micro LEDs in the first color micro LED panel 201 are collimated into a point, and the chief ray angles of the micro LEDs in the second color micro LED panel 202 are collimated into a point, the area of the output surface is greater than the area of the input surface. Furthermore, the diameter of the collimator unit 14 (the collimator group 1400) can be less than or equals to the side width of the X-cube. Additionally, the light emitted from a first light emitting area of the first color micro LED panels enters into a first receiving surface of the optical combination element 301. The side width of the first receiving surface of the optical combination element 301 is less than side width of the first light emitting area of the first color micro LED panel 201. The light emitted from a second light emitting area of the second color micro LED panels 202 enters into a second receiving surface of the optical combination element 301. The side width of the second receiving surface of the optical combination element 301 is less than side width of the second light emitting area of the second color micro LED panel 202.

In another embodiment, the diameter of the collimator unit 14 (the collimator group 1400) is greater than the side width of the X-cube. Preferably, the diameter of the collimator unit 14 (the collimator group 1400) is not greater than 200% of the side width of the X-cube 301.

Figure 37:
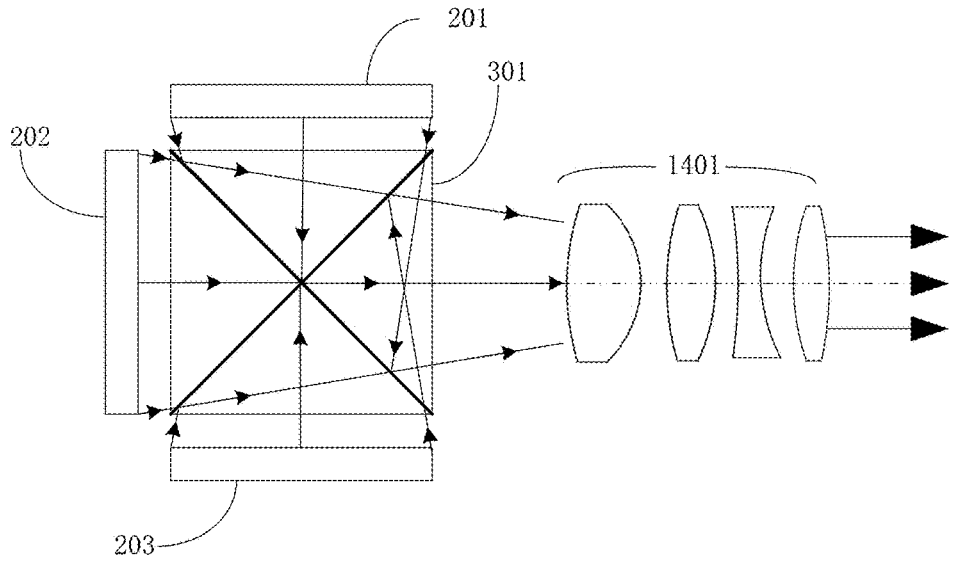

Additionally, in some embodiments consistent with FIG. 37, the micro LED projector orderly comprises: a first color micro LED panel 201, a second color micro LED panel 202, a third micro LED panel 203, an optical combination element 301, and the collimator group 1400. The first micro LED panel 201 emits a first color ray, the second micro LED panel 202 emits a second color ray, and the third micro LED panel 203 emits a third color ray.

The first micro LED panel 201 emits a first color ray, wherein, the first micro LED panel 201 comprises a first color micro LED structure array and the first color micro LED structure array comprises multiple first color micro LED structures. The first color micro LED structure is selected from the aforementioned micro LED structure with a first color light emitting layer. The second micro LED panel 202 emits a second color ray; wherein the second micro LED panel 202 comprises a second color micro LED structure array and the second color micro LED structure array comprises multiple second color micro LED structures. The second color micro LED structure is selected from the aforementioned micro LED structure with a second color light emitting layer. The third micro LED panel 203 comprises a third micro LED structure array and the third micro LED structure array comprises multiple third color micro LED structure; and the third color micro LED structure is selected from the aforementioned micro LED structure with a third color light emitting layer; wherein, the first color, the second color and the third color are different from each other. The optical combination element 301 comprises a first polarizing spectroscopic film, facing the first color ray emitted from the first micro LED panel 201 and the second color ray emitted from the second micro LED panel 202; and further comprises a second polarizing spectroscopic film facing the second color ray emitting direction of the second micro LED panel 202 and facing the third color ray emitting direction of the third micro LED panel 203. Preferably, the optical combination element 301 is an X-cube. The structure of the X-cube can be understood by those skilled in the field.

Furthermore, the collimated light emits from an output surface of the optical combination element 301 and then enters into an input surface of the collimator unit 14 (the collimator group 1400). The distance between the output surface of the optical combination element 301 (X-cube) and the input surface of the collimator unit 14 (the collimator group 1400) is greater than or equals to zero. Preferably, the distance between the output surface of the optical combination element 301 and the input surface of the collimator unit 14 is not greater than 200% of the thickness of the collimator unit 14.

Additionally, the chief ray angles of the micro LEDs in the first color micro LED panel 201 are collimated into a point, the chief ray angles of the micro LEDs in the second color micro LED panel 202 are collimated into a point, and the chief ray angles of the micro LEDs in the third color micro LED panel 203 are collimated into a point. The area of the output surface of the optical combination element 301 is greater than the area of the input surface of the collimator unit 14. Furthermore, the diameter of the collimator unit 14

(the collimator group 1400) can be less than or equals to the side width of the optical combination element, such as the side width of the X-cube. Additionally, the light emitted from a first light emitting area of the first color micro LED panel 201 enters into a first receiving surface of the optical combination element 301. The side width of the first receiving surface of the optical combination element 301 is less than side width of the first light emitting area of the first color micro LED panel 201. The light emitted from a second light emitting area of the second color micro LED panel 202 enters into a second receiving surface of the optical combination element 301. The side width of the second receiving surface of the optical combination element 301 is less than the side width of the second light emitting area of the second color micro LED panel 202. And the light emitted from a third light emitting area of the third color micro LED panel 203 enters into a third receiving surface of the optical combination element 301. The side width of the third receiving surface of the optical combination element 301 is less than the side width of the third light emitting area of the third color micro LED panel 203.

In some embodiments, the diameter of the collimator unit 14 (the collimator group 1400) is greater than the side width of the X-cube. Preferably, the diameter of the collimator unit 14 (the collimator group 1400) is not greater than 200% of the side width of the X-cube 301.

It is noted that, in some embodiments, the micro LED device is closed herein comprises one, two, three, four, or more micro LED panels.

Multiple micro LED structures are arranged in an array to form the micro LED array, which is used as the light emitting area of the micro LED panel. In the micro LED panel, the chief ray angles of the micro LED structures are different. For example, the chief ray angles of the micro LED structures are increased from any point above the micro LED array to the edge of the micro LED array, such as from the center of the micro LED array to the edge of the micro LED array; therefore, the chief rays of the micro LED structures in the micro LED array can be automatically collimated at the point above the micro LED array, such as the point in the center axis of the micro LED array, as shown in FIG. 19; and, this micro LED array panel is also showed in FIGS. 15~17. Preferably, the chief ray angles of the micro LED structures are increased in a certain amount, such as 1°, or other degrees. The certain amount is depended by the row number and the column number of the micro LED array and the dimension of the micro LED array. The chief ray angle can be changed by shifting the aforementioned reflective structure along the horizontal level; or, the chief ray angle can be changed by shifting the micro lens along the horizontal level in another embodiment, which can be referred to in U.S. patent application Ser. No. 17/486,113.

More details of the micro LED structure can be referred to in the description of Embodiment 1~4.

In some embodiments consistent with FIG. 35, because the dimension of the micro LED panel 15 being very small and the chief ray angle being adjustable, the dimension of the collimator group 1400 will be smaller. In some embodiments, the diameter of the lens in the collimator group 1400 is reduced and the thickness of the lens is reduced, so that the volume of the collimator group 1400 will be further reduced. In a similar manner, referring to embodiments consistent with FIGS. 36 and 37, since the dimension of the micro LED panel 201, 202, and 203 are very small and the chief ray angle is adjustable, the dimension of the optical combination element 301 and the dimension of the collimator group 1400 will be smaller. In some embodiments, the width of the X-cube is reduced, so that the volume of the X-cube is further reduced. In some embodiments, the diameter of the lens in the collimator group 1400 is reduced and the thickness of the lens is reduced, so that the volume of the collimator group 1400 is further reduced. In some more specific embodiments, the micro LED panel 201, 202, or 203 is not greater than 3 mm, the width of the X-cube is not greater than 3 mm, the diameter of lens in the collimator group 1400 is not greater than 3 mm and the length of the collimator group 1400 is not greater than 3 mm, so the optical engine or the micro LED projector is even smaller, which facilitates the device to be minimized with less weight. When the chief ray angles of the micro LED structures in the micro LED panel 201, 202, and 203 are different and collimated into a point (as mentioned above), the dimension of the X-cube and the dimension of the collimator group 1400 will become smaller and smaller.

In some embodiments, the center axis of the micro LED array is an axis vertical to the micro LED array panel and through the symmetrical center of the micro LED array. The horizontal level is parallel to the surface of the micro LED array panel.

In some further embodiments, a micro LED array panel can comprise multiple aforementioned micro LED formed into an array. The micro LED array panel is a micro self-emitting panel. The micro LED in the panel may be an organic LED or an inorganic LED. The light emitting area of the micro LED array panel is very small, such as 3 mm*5 mm. It is noted that, the light emitting area is the area of the micro LED array. The micro LED array panel comprises a micro LED array that forms a pixel array, such as 1600× 1200, 680×480, and 1920×1080. The diameter of the micro LED is in the range of 200 nm~2 μm. An IC back plane is formed at the back surface of the micro LED array and electrically connected with the micro LED array. The IC back plane acquires signals such as image data from outside via signal lines to control a corresponding micro LED to emit light. The IC back plane generally employs an 8-bit Digital to analog converter (DAC). The 8-bit DAC has 256 levels of manifestations, and each level corresponds to one gray level, that is, the 8-bit DAC may provide 256 different gray levels. Since any one of the 256 gray levels may be applied on the micro LED, a gray level ranging from 0 to 255 may be displayed by one pixel. Optionally, a brightness value of the micro LED can be controlled by voltage amplitudes or current amplitudes of the signals acquired by the IC back plane, while the gray levels can be shown by time intervals, e.g., pulse widths, of the signals.

More details of the micro LED projector and the micro LED panel can be referred to in the description of Embodiments 1 to 4.

Embodiment 6

Figure 38:
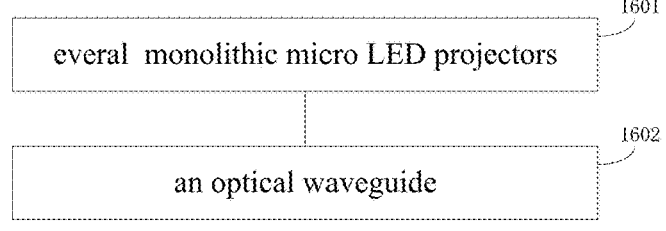
FIG. 38 is a block diagram of a micro LED display device according to a sixth embodiment of the present disclosure.

In some embodiments consistent with FIG. 38, a micro LED display device is provided and comprises: at least one monolithic micro LED projectors 1601 and an optical waveguide 1602. The monolithic micro LED projectors 1601 are formed to separately generate monochrome images in one color or in different colors. The optical waveguide 1602 is formed to receive the monochrome images from the monolithic micro LED projectors, respectively. The optical waveguide 1602 is further formed to deliver the monochrome images and then combine the monochrome images into an objective image by overlapping them.

In some embodiments, the monolithic micro LED projector comprises: a monolithic micro LED panel and a collimator group, wherein, light from the monolithic micro LED panel is formed to transmit into the collimator group and is corrected therein. The monolithic micro LED projector can be referred to as the aforementioned micro LED projector shown in FIGS. 32~35. Herein, the micro LED array in the monolithic micro LED panel applies micro LEDs for displaying pixels. The chief ray angles of the micro LEDs are different in the micro LED panel. Herein, the micro LED comprises a micro mesa structure and a micro lens, wherein at least in some micro LEDs, the center axis of the micro lens is shifted from the center axis of the micro mesa structure. It is noted that, the chief ray angle of the micro LED structure can be realized by the reflective structure 00 as described in Embodiment 1, which can be further referred to in the U.S. patent application Ser. No. 17/486,113. Furthermore, the micro LED structure can be aforementioned micro LED structure in Embodiments 1~5. Further, details of the micro LED structure can be referred to in the description of Embodiments 1~5. In some embodiments, the dimension of the micro LED projector is not greater than 5 mm×5 mm×5 mm, the dimension of the micro LED panel is not greater than 5 mm×5 mm, the thickness of the micro LED display device is not greater than 3 mm.

Herein, the chief ray angles of the micro LEDs in the micro LED panel are increased from any point above the micro LED array to the edge of the micro LED array. Preferably, in some embodiment, the chief ray angles of the micro LEDs in the micro LED panel are increased from the center of the micro LED array to the edge of the micro LED array. Further details of the chief ray angles and the relationship of the chief ray angle and the micro LED array can be referred to in the description of Embodiments 1~5.

Because the chief ray angles of the micro LEDs are formed to collimate into a certain direction, the light area on the collimator group is smaller than that from the conventional micro LED projector having the micro LEDs with a same chief angle at 90°, thereby reducing the volume of the micro LED projector and reducing the volume of the optical waveguide, which facilitates the combination of the micro LED projectors and the optical waveguide. Furthermore, the micro LED display device can be facilitated to reduce the weight and volume of any headset, a head-up device, a VR device, and an AR device, or any other micro display device.

Figure 39:
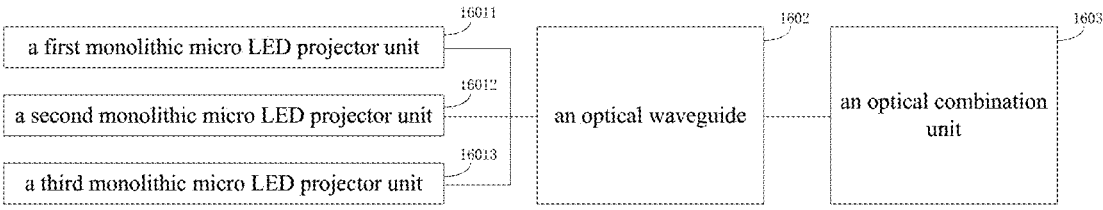
FIG. 39 is a block diagram of a micro LED display device according to a sixth embodiment of the present disclosure.
Figure 40:
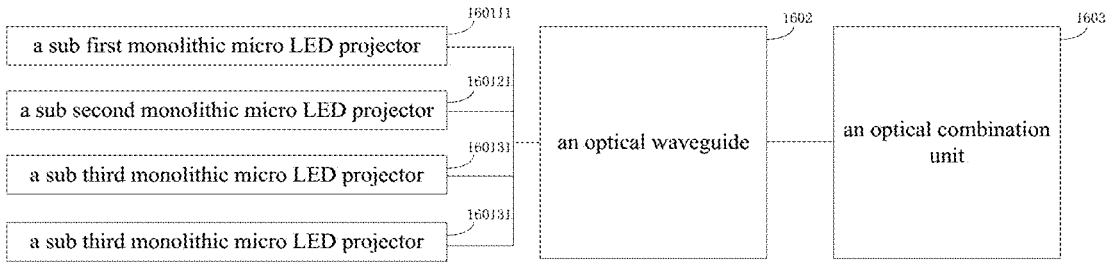
FIG. 40 is a block diagram of a micro LED display device according to a sixth embodiment of the present disclosure.

Additionally, in some embodiment consistent with FIG. 39, the monolithic micro LED projector comprises: a first monolithic micro LED projector unit 16011, a second monolithic micro LED projector unit 16012, and a third monolithic micro LED projector unit 16013. The first monolithic micro LED projector unit 16011 generates a first monochrome image in a first color, the second monolithic micro LED projector unit 16012 generates a second monochrome image in a second color, and the third monolithic micro LED projector unit 16013 generates a third monochrome image in a third color. Furthermore, the first monolithic micro LED projector unit 16011 comprises at least one first sub-monolithic micro LED projector 160111; the second monolithic micro LED projector 16012 unit comprises at least one second sub-monolithic micro LED projector 160121, and the third monolithic micro LED projector unit 16013 comprises at least one third sub-monolithic micro LED projectors 160131. Preferably, in some embodiments consistent with FIG. 40, the first monolithic micro LED projector unit 16011 comprises one first sub-monolithic micro LED projector 160111, the second monolithic micro LED projector unit 16012 comprises one second sub-monolithic micro LED projector 160121, and the third monolithic micro LED projector unit 16013 comprises two third sub-monolithic micro LED projectors 160131. It is noted that, the first color, the second color, and the third color are different. In some embodiments, the first color is blue, the second color is green, and the third color is red. In some embodiments consistent with FIG. 41, the micro LED display device is a glass 1701. The glass 1701 comprises one blue micro LED projector B, one green micro LED projector G, and two red micro LED projectors R.

Figure 42:
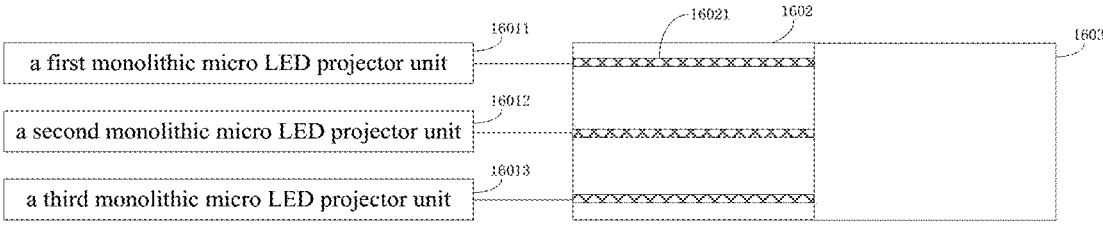
FIG. 42 is a structure diagram of a micro LED display device according to a sixth embodiment of the present disclosure.
Figure 43:
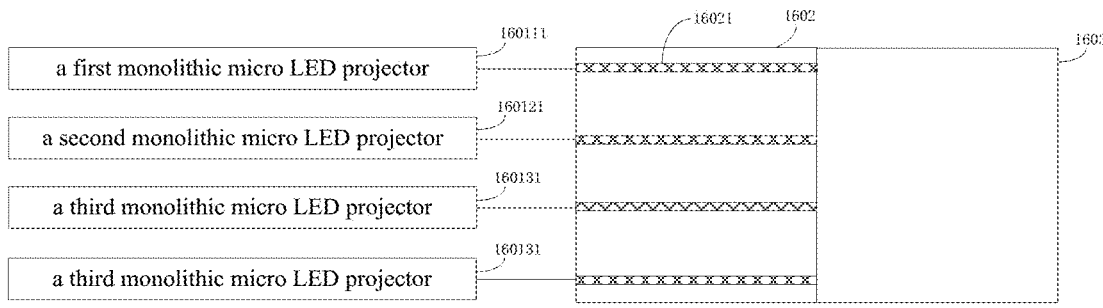
FIG. 43 is a structure diagram of a micro LED display device according to a sixth embodiment of the present disclosure.

In some embodiments consistent with FIG. 42, the optical waveguide comprises at least two optical grating channels 16021 aligned with the monolithic micro LED projector units 16011, 16012, and 16013, respectively; and delivers the different color monochrome images, respectively. In some embodiments consistent with FIG. 43, the optical waveguide 1602 comprises at least two optical grating channels 16021 aligned with the monolithic micro LED projectors 160111, 160121, and 160131, respectively, and delivers the monochrome images, respectively.

In some embodiment consistent with FIGS. 38 and 39, the micro LED display device comprises an optical combination unit 1603. The optical combination unit 1603 is formed to receive the monochrome images and is formed to combine monochrome images into an objective image by overlapping them. The optical combination unit 1603 can be a conventional optical combination unit as small as possible and can be adapted to the optical waveguide 1602, which can be understood by those skilled in the art.

It is noted that, in the embodiments consistent to FIGS. 34~37, a space is formed between the monolithic micro LED projector 1601 and the optical waveguide 1602. The space between the surface of the collimator unit 14 and the optical waveguide 1602 is not greater than the thickness of the collimator unit 14. Preferably, the distance between the surface of the collimator unit 14 and the optical waveguide 1602 is not greater than 3 mm.

Furthermore, the optical waveguide 1602 comprises an input region. The chief ray emitted from the collimator unit 14 is formed to be parallel with the normal direction of the input region. The deviation of the angle between the chief ray emitted from the collimator unit 14 and the normal direction of the input region is not greater than 5°.

The micro LED display device can be applied in a micro LED glass. The micro LED glass comprises the aforementioned monolithic micro LED projector 1601 and the optical waveguide 1602, which will not be repeated herein. The relationship of the monolithic micro LED projector 1601 and the glass will be further described hereinafter.

Figure 44:
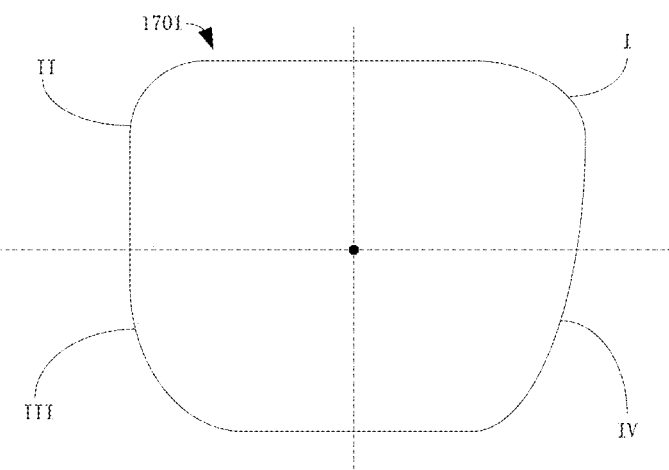
FIG. 44 is a structure diagram of four quadrant regions in a micro LED glass according to a sixth embodiment of the present disclosure.

In some embodiments consistent to FIG. 44, based on the center of the glass 1701 (the black dot) and the perpendicular cross lines (the two perpendicular cross dotted lines), the glass 1701 is formed in four quadrants (four areas formed by the two dotted lines). The glass comprises four quadrant regions I, II, III, and IV, divided by the aforementioned four quadrants based on the center of the glass. It is noted that, the center of the glass 1701 is the geometric center of the glass 1701. In some embodiments, the center of the glass 1701 is the position facing the human's eye. The four quadrant regions I, II, III, and IV are provided as a first quadrant region I, a second quadrant region II, a third quadrant region III, and a fourth quadrant region IV, respectively.

Furthermore, the monolithic micro LED projectors can be formed in the glass, at the edge of the glass, or outside of the glass.

The monolithic micro LED projector is formed in at least one quadrant region I, II, III or IV. In some embodiments, the monolithic micro LED projector is formed in at least one of the first quadrant region I, the second quadrant region II, the third quadrant region III, or the fourth quadrant region IV. In some embodiments, the monolithic micro LED projectors are not formed in the same quadrant region. In some embodiments, each one of the monolithic micro LED projectors is separately formed in a different quadrant region.

Figure 45:
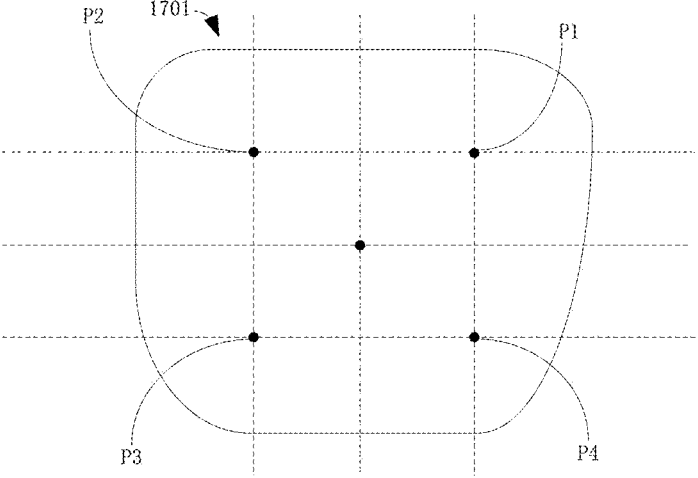
FIG. 45 is a structure diagram illustrating the distribution of the monolithic micro LED projectors in a micro LED glass according to a sixth embodiment of the present disclosure.

Preferably, in some embodiments consistent to FIG. 45, the dots P1, P2, P3, P4 are the centers of the four quadrant regions I, II, III, IV, respectively. Each of the four quadrants is divided into four sub quadrants, which is provided as sub-quadrants in each of the four quadrants. Preferably, in some embodiments consistent to FIGS. 46~49, the monolithic micro LED projector is formed to be positioned in or at the edge of at least one quadrant region I, II, III or IV.

Figure 46:
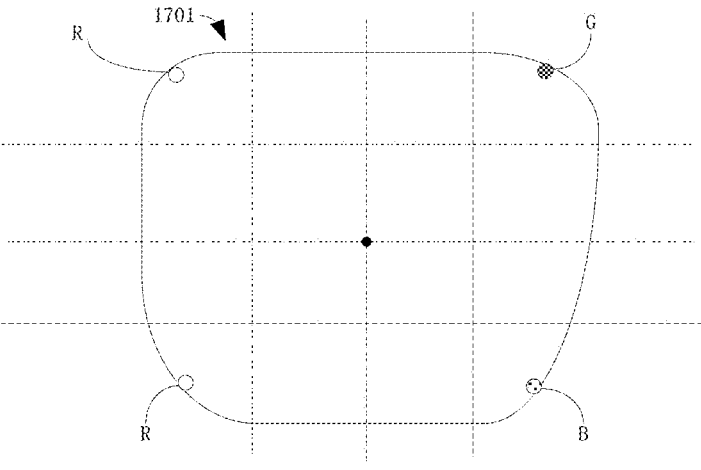
FIGS. 46~49 are structure diagrams illustrating the distribution of the monolithic micro LED projectors in a micro LED glass according to a sixth embodiment of the present disclosure.
Figure 47:
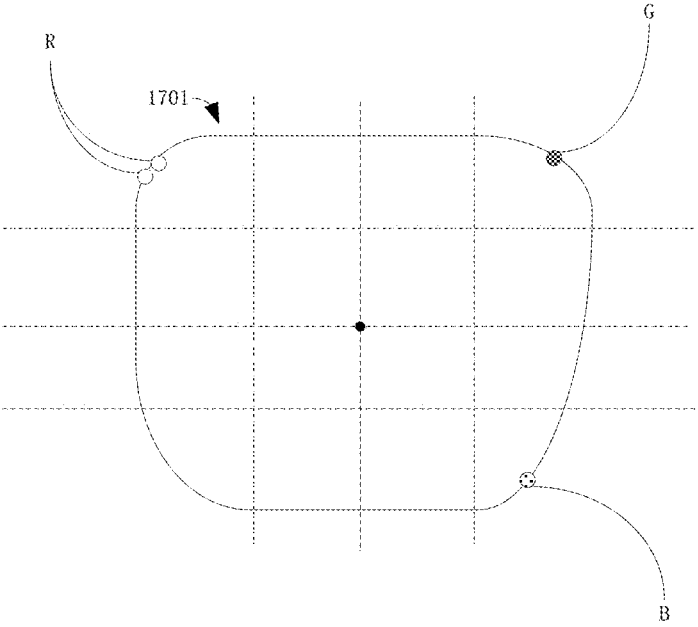
Figure 48:
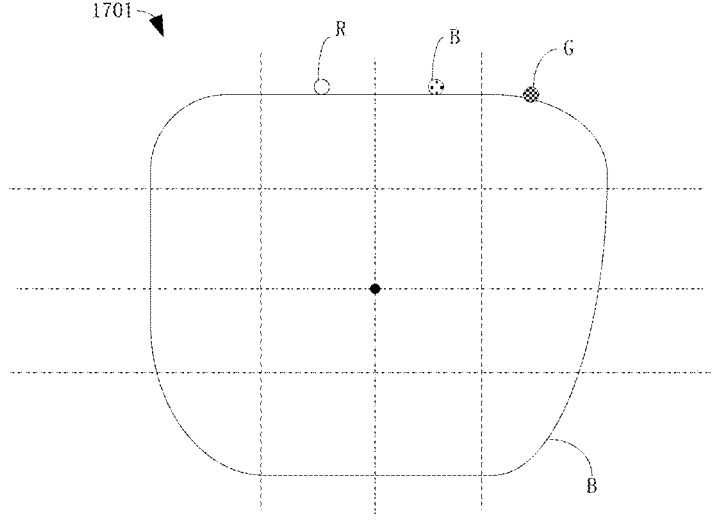
Figure 49:
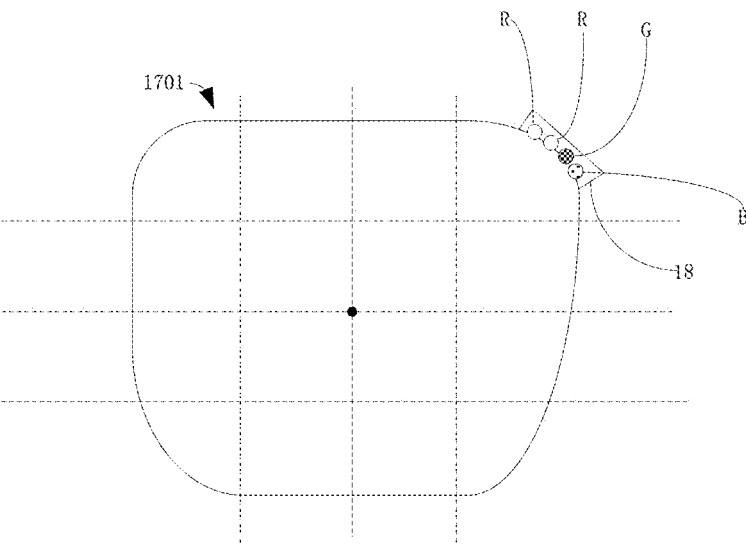

In some embodiments consistent to FIGS. 46 and 47, the monolithic micro LED projector is formed at the four corner of the glass. In some embodiments, the monolithic micro LED projectors are formed in different quadrant regions from each other. In some embodiments consistent to FIG. 46, the red micro LED projectors R are positioned in the second quadrant region II and the third quadrant region III, the green micro LED projector G is positioned in the first quadrant region I, and the blue micro LED projector B is positioned in the fourth quadrant region IV.

In some embodiments, some monolithic micro LED projectors are formed in the same quadrant region and some of the monolithic micro LED projectors are formed in different quadrant region from each other. In some embodiments consistent to FIG. 47, the red micro LED projectors R are positioned in the second quadrant regions II, the green micro LED projector G is positioned in the first quadrant region I, and the blue micro LED projector B is positioned in the fourth quadrant region IV.

Figure 41:
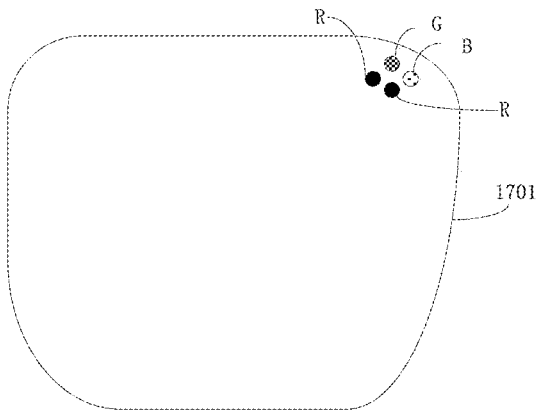
FIG. 41 is a structure diagram of a micro LED glass according to a sixth embodiment of the present disclosure.

Additionally, the monolithic micro LEDs can be positioned in a same quadrant region, such as the glass shown in FIG. 41. Additionally, in some embodiments consistent to FIG. 48, the monolithic micro LED projectors are formed to be positioned either at the top edge, the bottom edge, the left side edge, or the right side edge of the glass.

In some embodiments, the monolithic micro LED projectors are formed to be positioned outside of the glass. In some embodiments consistent to FIG. 49, an edge protruding part 18 is extended outward from the edge of the glass 1701. The monolithic micro LED projectors R, G, and B are formed to be positioned at the edge protruding part 18 with the light emitting surface of the monolithic micro LED projectors R, G, B facing the input region of the optical waveguide 1602. Additionally, the edge protruding part 18 can connect the glass with a glass leg or with any other element. Furthermore, the edge protruding part 18 is connected to the edge of at least one of the four quadrants. Preferably, the edge protruding part 18 is corresponding to the edge of at least one of the sub-quadrants, for example, the edge of the sub-quadrant at the top-right corner.

In some embodiments consistent to FIG. 45, the monolithic micro LED projectors are formed to be positioned near the center P1, P2, P3 or P4. It is noted that, the monolithic micro LED projector can be formed at the center P1, P2, P3 or P4, or at a deviation position from the center P1, P2, P3 or P4. Furthermore, in each of the quadrant regions I, II, III, and IV, the deviation distance between the monolithic micro LED projector and the center P1, P2, P3 or P4 is not greater than 50% to 150% of the distance between the center P1, P2, P3 or P4 and the center of the glass (the dot at the center of the glass 1701). In some embodiments, the deviation distance between the monolithic micro LED projector and the center P1, P2, P3 or P4 ranges from 0.1 mm to 3 mm. It is noted that, the center of one quadrant region I, II, III or IV is the geometric center of the quadrant, respectively. Additionally, it is noted that, the aforementioned position of the monolithic micro LED projector equals to the following position of the monolithic micro LED projector. The area of one quadrant region I, II, III or IV is divided into four sub-areas based on the center of the glass. The monolithic micro LED projector is positioned near or at the shared corner (the position of the dot P1, P2, P3 or P4) of the four sub-areas. The deviation of the monolithic micro LED projector from the shared corner is not greater than 5% of the side length of the sub-area.

Figure 50:
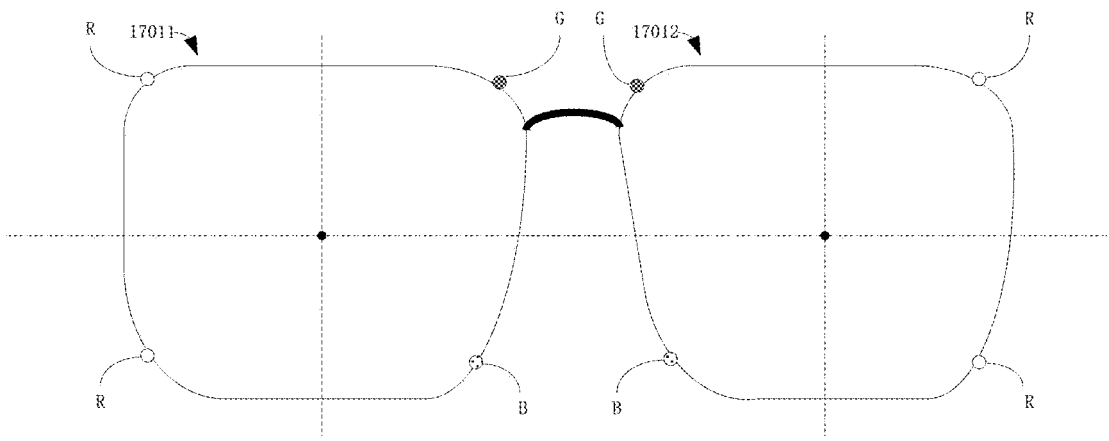
FIGS. 50~52 are structure diagrams illustrating the distribution of the monolithic micro LED projectors in a pair of micro LED glasses according to a sixth embodiment of the present disclosure.
Figure 51:
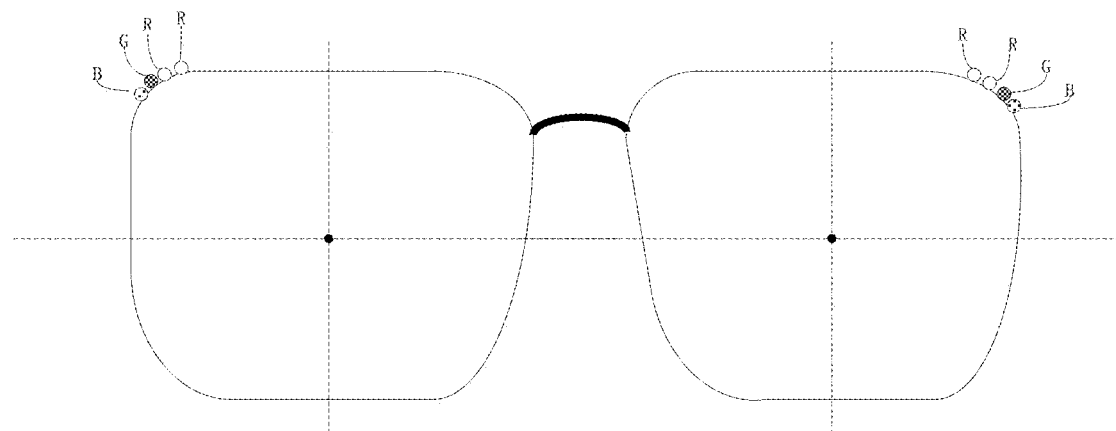
Figure 52:
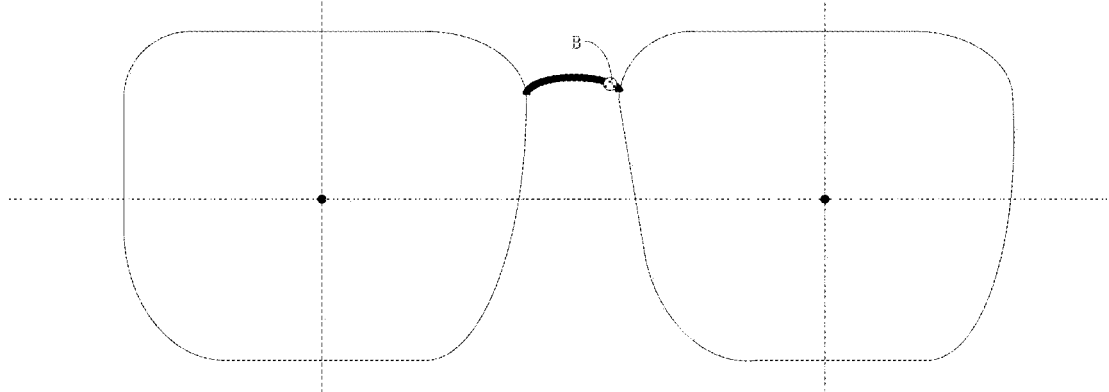

Herein, in some embodiments, the glass can be a monocular glass. Furthermore, in some embodiments, the glass is capable of being applied in pair. The monolithic micro LED projectors are positioned in a pair of glasses and the monolithic micro LED projectors are positioned in different glasses. Herein, the left glass comprises same number and color of the monolithic micro LED projectors as the right glass. In some embodiments, the number of the monolithic micro LED projectors in the left glass is different from that of the right glass. The color of the monolithic micro LED projectors in the left glass is different from that of the right glass. Furthermore, the position of the monolithic micro LED projectors in the left glass is the same as the position of the monolithic micro LED projectors in the right glass. Preferably, the position of the monolithic micro LED projectors in the left glass mirrors the position of the monolithic micro LED projectors in the right glass. In some embodiments, the position of the monolithic micro LED projectors in the left glass is different from the position of the monolithic micro LED projectors in the right glass. The position of the monolithic micro LED projectors in the left glass is symmetrical or asymmetrical to the position of the monolithic micro LED projectors in the right glass base on the center axis between the left glass and the right glass. In some embodiments consistent to FIG. 50, the distribution of the green micro LED projector G, the blue micro LED projector B, and the red micro LED projectors R in the left glass 17011 is symmetrical to that in the right glass 17012. In some embodiments consistent to FIG. 51, the green micro LED projector G, the blue micro LED projector B, and the red micro LED projectors R are all formed in a same quadrant of the left glass and symmetrical to the respective projectors in the right glass. It is noted that, the distribution of the monolithic micro LED projectors in the left glass may not be symmetrical to the distribution of the monolithic micro LED projectors in the right glass. In some embodiments, the monolithic micro LED projectors may be only formed in the right glass or in the left glass. In some embodiments consistent to FIG. 52, a middle connected part is formed to be positioned between the left glass and the right glass, the monolithic micro LED projector can also be formed at the middle connected part. Preferably, in some embodiments, the monolithic micro LED projector is formed to be positioned at the middle connected part and near either the left glass or the right glass. In some embodiments, the green micro LED projector is formed to be positioned at the middle connected part near the right glass.

In some embodiments, either the number or the color of the monolithic micro LED projectors in the left glass is different from that in the right glass, the left glass displays a first color image and the right glass displays a second color image. Additionally, in some embodiments, the number of monolithic micro LED projectors in the left glass is different from the number of monolithic micro LED projectors in the right glass and the left glass displays the same color image as the right glass. Furthermore, the position of monolithic micro LED projectors in the left glass differs from the position of monolithic micro LED projectors in the right glass, and the left glass displays the same color image as the right glass.

Figure 53:
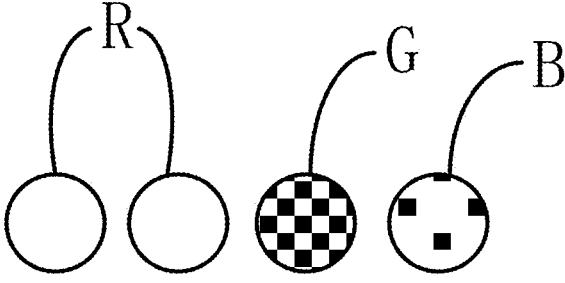
FIG. 53 is structure diagrams illustrating one dimensional distribution of the monolithic micro LED projectors according to a sixth embodiment of the present disclosure.
Figure 54:
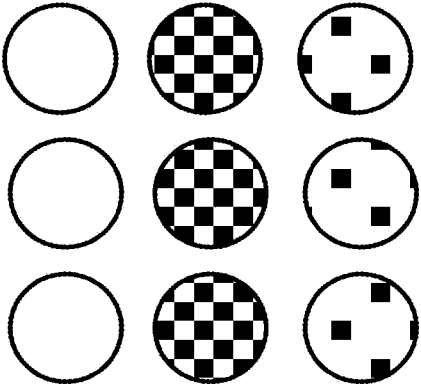
FIG. 54 is structure diagrams illustrating an array of the monolithic micro LED projectors according to a sixth embodiment of the present disclosure.

Furthermore, the monolithic micro LED projectors are formed in one dimensional array; for example, referring to FIG. 53, the red micro LED projectors R, the green micro LED projector G and the blue micro LED projector B are arranged in a line. In some embodiment, referring to FIG. 54, the monolithic micro LED projectors are formed in an M×N array, Wherein, M is a positive integer and not less than 1 and N is a positive integer and not less than 1. In another embodiment, the monolithic micro LED projectors can be formed in any geometrical shape. For example, the monolithic micro LED projectors can be formed in the shape of circle, triangle or trapezoid, or any other shape.

Additionally, the optical waveguide comprises an image output region. In some embodiments, when a human puts on the glasses, the image output region is facing to at least one eye of the human.

It is noted that, the micro LED glasses can be an AR glasses, a VR glasses, or any other types of glasses.

It is noted that, the number of the monolithic micro LED projector units is not limited to three as mentioned above; it can also be four, five, and more. Furthermore, the number of the optical grating channels is the same as that of the monolithic micro LED projector units, or the same as that of the monolithic micro LED projectors.

It is further noted that, the micro LED panel comprises a micro LED array and an IC back plane formed at the back of the micro LED array, controlling the turning-on or turning-off of each LED in the micro LED array. In some embodiments, the micro LED array is bonded to the IC back plane by a metal bonding process. Each of the micro LED panels is separately controlled by the corresponding IC back plane thereof. In some embodiments, in the first color micro LED panel, the IC back plane is formed to control the micro LED array in the first color micro LED panel and is further formed to not control the micro LED array in the second color micro LED panel.

It is noted that, in some embodiments, the micro LED projectors are positioned into the glass, the edge protruding part, or the middle connected part. In another embodiment, the micro LED projectors can be arranged at any position of the glass, the edge protruding part or the middle connected part, to ensure that the chief ray emitted from the collimator unit 14 can enter into the input region of the optical waveguide.

The above descriptions are merely embodiments of the present disclosure, and the present disclosure is not limited thereto. Modifications, equivalent substitutions, and improvements made without departing from the conception and principle of the present disclosure shall fall within the scope of protection of the present disclosure.

The embodiments may further be described using the following clauses:

1. A micro light emitting diode (LED) projector, comprising:

a micro LED panel, comprising a micro LED structure array, wherein, the micro LED structure comprises a mesa structure and a micro lens formed to be above the micro mesa structure, a p type semiconductor layer, a n type semiconductor layer, and a light emitting layer formed between the p type semiconductor layer and the n type semiconductor layer; and a collimator unit, formed to collimate rays emitted from the micro LED structure to a preset objective position;

wherein, a connected straight line connects the center of the collimator unit, the center of the micro lens and the center of the light emitting layer.

2. The micro LED projector according to clause 1, wherein, the center of the collimator unit is deviated from the connected straight line; wherein, the center of the micro lens and the center of the light emitting layer are at a first straight line; the center of the collimator unit and the center of the light emitting layer are at a second straight line.

3. The micro LED projector according to clause 2, wherein, the second straight line is deviated from the first straight line.

4. The micro LED projector according to clause 3, wherein, the deviated angle of the second straight line deviated from the first straight line is not more than 5°.

5. The micro LED projector according to clause 1, wherein, the center of the light emitting layer is horizontally deviated from the connected straight line.

6. The micro LED projector according to clause 5, wherein, the deviated distance of the center of the light emitting layer horizontally deviated from the connected straight line is not more than 45% of the bottom width of the mesa structure.

7. The micro LED projector according to clause 6, wherein, the deviated distance of the center of the light emitting layer is not more than 0.3 μm.

8. The micro LED projector according to clause 1, wherein, the distance between the micro LED panel and the surface of the collimator unit is not greater than the thickness of the collimator unit.

9. The micro LED projector according to clause 1, wherein, the shape of the micro lens is a semi-sphere or a sphere.

10. The micro LED projector according to clause 1, wherein, the micro LED structure further comprises a capping layer, formed to be above the micro mesa structure and covering the micro lens.

11. The micro LED projector according to clause 10, wherein, the material of the capping layer is selected from polymers, inorganic oxide, and inorganic nitride.

12. The micro LED projector according to clause 11, wherein, the inorganic oxide is silicon oxide and the inorganic nitride is silicon nitride.

13. The micro LED projector according to clause 1, wherein, the center axis of the micro lens is shifted from the center axis of the mesa structure horizontally.

14. The micro LED projector according to clause 1, wherein, the micro LED structure further comprises a spacer at the bottom of the micro lens and on the top of the mesa structure.

15. The micro LED projector according to clause 14, wherein, the material of the spacer is selected from polymers, inorganic oxide, and inorganic nitride.

16. The micro LED projector according to clause 15, wherein, the inorganic oxide is silicon oxide and the inorganic nitride is silicon nitride.

17. The micro LED projector according to clause 10, wherein, the material of the capping layer is different from the material of the micro lens.

18. The micro LED projector according to clause 1, wherein, the material of the micro lens is selected from polymers, inorganic oxide, and inorganic nitride.

19. The micro LED projector according to clause 18, wherein, the inorganic oxide is silicon oxide and the inorganic nitride is silicon nitride.

20. The micro LED projector according to clause 1, wherein, the diameter of the micro lens is 80%~200% of the diameter of the mesa structure.

21. The micro LED projector according to clause 1, wherein, the distance between the focal point of the micro lens and the light emitting layer is not greater than two times of the thickness of the mesa structure.

22. The micro LED projector according to clause 1, wherein, the micro LED structure further comprises an antireflective film, formed on at least part of the surface of the micro lens.

23. The micro LED projector according to clause 22, wherein, the antireflective film is formed on the surface position where the ray is emitted from the micro lens.

24. The micro LED projector according to clause 23, wherein, the chief ray is inclined to the top surface of the micro mesa structure and is emitted from the micro lens at an angle in a range of 0~45° relative to the vertical direction.

25. The micro LED projector according to clause 24, wherein, the chief ray is vertical to the top surface of the micro mesa structure and is emitted from the top center of the micro lens.

26. The micro LED projector according to clause 22, wherein, the antireflective film is formed on the top of the micro lens.

27. The micro LED projector according to clause 22, wherein, the antireflective film is formed on the entire surface of the micro lens.

28. The micro LED projector according to clause 27, wherein, the thickness of the antireflective film on the surface position where the ray is emitted from the micro lens is greater than the thickness of the antireflective film on the other positions of the micro lens.

29. The micro LED projector according to clause 27, wherein, the thickness of the antireflective film on the top of micro lens is greater than the thickness of the antireflective film on the other positions of the micro lens.

30. The micro LED projector according to clause 22, wherein, the dielectric constant of the antireflective film is between the dielectric constant of the micro lens and the dielectric constant of air.

31. A micro LED projector, comprising:

a first color micro LED panel according to the micro LED panel of clause 1, emitting a first color ray;

a second color micro LED panel according to the micro LED panel of clause 1, emitting a second color ray; wherein, the first color is different from the second color;

an optical combination element, facing the first color ray emitting direction of the first color micro LED panel and facing the second color ray emitting direction of the second color micro LED panel, formed to combine the first color ray and second color ray into a combined ray;

a collimator unit according to the collimator unit of clause 1, formed to collimate the ray emitted from the micro LED structure to a preset objective position.

32. The micro LED projector according to clause 31, wherein, the optical combination element comprises a polarizing spectroscopic film, facing the first color ray emitting direction of the first color micro LED panel and facing the second color ray emitting direction of the second color micro LED panel.

33. The micro LED projector according to clause 31, wherein, the micro LED projector further comprises a third color micro LED panel according to the micro LED panel of clause 1, emitting a third color ray; wherein, the first color, the second color, and the third color are different from each other.

34. The micro LED projector according to clause 33, wherein, the optical combination element comprises a polarizing spectroscopic film, facing the third color ray emitting direction of the third color micro LED panel.

35. The micro LED projector according to clause 33, wherein, the optical combination element is an X-cube.

36. The micro LED projector according to clause 31, wherein, the minimum distance between the micro LED panel and the surface of the optical combination element facing the micro LED panel is not greater than twice of the thickness of the micro LED panel.

37. The micro LED projector according to clause 31, wherein, the collimated light emits from an output surface of the optical combination element and then enters into an input surface of the collimator unit; the distance between the output surface of the optical combination element and the input surface of the collimator unit is not more than 200% of the thickness of the collimator unit.

38. The micro LED projector according to clause 31, wherein, the diameter of the collimator unit is smaller than the side width of the X-cube.

39. A micro LED projector, comprising:

at least one color micro LED panel comprising multiple micro LEDs; the chief ray angles of the micro LEDs in the micro LED panel are different;

a collimator unit, configured to collimate the ray emitted from the micro LED panel to a preset objective position; the micro LED panel has a light emitting area and the collimator has an input surface, the light emitted from the light emitting area of the micro LED panel enters into the input surface of the collimator.

40. The micro LED projector according to clause 39, wherein, the chief ray angle of the micro LEDs in the at least one color micro LED panel are collimated into a point.

41. The micro LED projector according to clause 40, wherein, at least two kinds of color micro LED panel, each of the micro LED panel emitting one color ray; and, the chief ray angles of the micro LEDs in each of the micro LED panel are collimated into a point.

42. The micro LED projector according to clause 41, wherein, at least a first color micro LED panel, emitting a first color ray; a second color micro LED panel, emitting a second color ray; and a third color micro LED panel emitting a third color ray; wherein, the first color, the second color and the third color are different from each other; and, the chief ray angle of the micro LEDs in the first color micro LED panel are collimated into a point, the chief ray angle of the micro LEDs in the second color micro LED panel are collimated into a point and the chief ray angle of the micro LEDs in the third color micro LED panel are collimated into a point.

43. The micro LED projector according to clause 41, wherein, the micro LED projector further comprises an optical combination element, facing the color ray emitting directions of each color of the micro LED panels, configured to combine the color rays into a combined ray; wherein, the collimated light emits from an output surface of the optical combination element and then enters into an input surface of the collimator unit.

44. The micro LED projector according to clause 43, wherein, the area of the output surface is greater than the area of the input surface.

45. The micro LED projector according to clause 43, wherein, the diameter of the collimator unit is smaller than the side width of the optical combination element.

46. The micro LED projector according to clause 43, wherein, the optical combination element has several receiving surfaces corresponding to each of the light emitting areas of the micro LED panels, respectively; and, the minimum distance between the micro LED panel and the receiving surface of the optical combination element is not greater than 200% of the thickness of the micro LED panel.

47. The micro LED projector according to clause 46, wherein, the side width of the receiving surface of the optical combination element is smaller than the side width of the light emitting area of the first color micro LED panel.

48. The micro LED projector according to clause 43, wherein, the distance between the output surface of the optical combination element and the input surface of the collimator unit is not more than 200% of the thickness of the collimator unit.

49. The micro LED projector according to clause 48, wherein, the distance between the output surface of the optical combination element and the input surface of the collimator unit is zero.

50. The micro LED projector according to clause 43, wherein, the optical combination element comprises a polarizing spectroscopic film, facing the first color ray emitting direction of the first color micro LED panel and facing the second color ray emitting direction of the second color micro LED panel.

51. The micro LED projector according to clause 50, wherein, the micro LED projector further comprises a third color micro LED panel, emitting a third color ray; wherein, the first color, the second color, and the third color are different from each other.

52. The micro LED projector according to clause 51, wherein, the optical combination element comprises a polarizing spectroscopic film, facing the third color ray emitting direction of the third color micro LED panel.

53. The micro LED projector according to clause 43, wherein, the optical combination element is an X-cube.

54. The micro LED projector according to clause 53, wherein, the diameter of the collimator unit is smaller than or equal to the side width of the X-cube.

55. The micro LED projector according to clause 39, wherein, the light emitting area of the micro LED panel is greater than the input surface of the collimator unit.

56. The micro LED projector according to clause 55, wherein, the width of the micro LED panel is larger than the diameter of the input surface of the collimator unit.

As used herein, unless specifically stated otherwise, the term "or" encompasses all possible combinations, except where infeasible. For example, if it is stated that a micro LED panel may include A or B, then, unless specifically stated otherwise or infeasible, the micro LED panel may include A, or B, or A and B. As a second example, if it is stated that a micro LED panel may include A, B, or C, then, unless specifically stated otherwise or infeasible, the micro LED panel may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

The invention claimed is:

1. A micro LED display device, comprising:
a circuit board having a first end and a second end;
a micro display panel configured on a first surface of the first end of the circuit board and electrically connected to the circuit board;
a support base formed on a second surface of the first end of the circuit board, wherein the second surface of the first end is opposite to the first surface of the first end;
a flash memory formed on a first surface of the second end of the circuit board and electrically connected to the circuit board;
a connector formed on a second surface of the second end of the circuit board, wherein the second surface of the second end is opposite to the first surface of the second end; and
a central processing unit formed between the connector and the second surface of the second end of the circuit board and electrically connected to the circuit board.

2. The micro LED display device according to claim 1, wherein the micro display panel and the flash memory are on the same surface of the circuit board.

3. The micro LED display device according to claim 1, wherein the support base and the connector are on the same surface of the circuit board.

4. The micro LED display device according to claim 1, wherein an edge of the micro display panel is configured not to exceed an edge of the circuit board.

5. The micro LED display device according to claim 1, wherein an edge of the support base is configured not to exceed an edge of the circuit board.

6. The micro LED display device according to claim 1, wherein an edge of the flash memory is configured not to exceed an edge of the circuit board.

7. The micro LED display device according to claim 1, wherein an edge of the connector is not to exceed an edge of the circuit board.

8. The micro LED display device according to claim 1, wherein the central processing unit is electronically coupled to the flash memory.

9. The micro LED display device according to claim 1, wherein the circuit board is configured to be a strip shape.

10. The micro LED display device according to claim 1, wherein the circuit board comprises flexible material configured to withstand bending force.

11. The micro LED display device according to claim 1, further comprising a cooling element configured to transfer heat of the micro display panel.

12. The micro LED display device according to claim 11, wherein the cooling element is formed on a back of the support base, and between the support base and the circuit board.

* * * * *